US011119591B2

(12) United States Patent
Hong et al.

(10) Patent No.: US 11,119,591 B2
(45) Date of Patent: Sep. 14, 2021

(54) DISPLAY APPARATUS AND MANUFACTURING METHOD THEREOF

(71) Applicant: Samsung Display Co., Ltd., Yongin-si (KR)

(72) Inventors: Jong Ho Hong, Yongin-si (KR); Won Il Choi, Yongin-si (KR); Bek Hyun Lim, Yongin-si (KR); Hye Jin Joo, Yongin-si (KR)

(73) Assignee: Samsung Display Co., Ltd.

( * ) Notice: Subject to any disclaimer, the term of this patent is extended or adjusted under 35 U.S.C. 154(b) by 355 days.

(21) Appl. No.: 15/207,093

(22) Filed: Jul. 11, 2016

(65) Prior Publication Data

US 2017/0139513 A1 May 18, 2017

(30) Foreign Application Priority Data

Nov. 17, 2015 (KR) .................. 10-2015-0161225

(51) Int. Cl.
*G06F 3/041* (2006.01)
*H01L 27/32* (2006.01)
(Continued)

(52) U.S. Cl.
CPC ......... *G06F 3/0412* (2013.01); *G02B 26/005* (2013.01); *G02F 1/1368* (2013.01); *G02F 1/13338* (2013.01); *G02F 1/13394* (2013.01); *G02F 1/13439* (2013.01); *G02F 1/133305* (2013.01); *G02F 1/133308* (2013.01);
(Continued)

(58) Field of Classification Search
CPC ...... G06F 3/0412; G06F 3/0416; G06F 3/044; G06F 2203/04102; G06F 2203/04103; G06F 2203/04105; G06F 2203/04111; G02B 26/005; G02F 1/133305; G02F 1/133308; G02F 1/13338; G02F 1/1368; G02F 1/167; G02F 2001/13398; G02F 2202/28; G02F 1/13394; G02F 1/134336; G02F 1/13439; G02F 1/136286; H01L 27/323; H01L 51/0097; H01L 51/5203;
(Continued)

(56) References Cited

U.S. PATENT DOCUMENTS 9,377,889 B2    6/2016 Endo et al.
2006/0008665 A1* 1/2006 Kotsubo ............. B32B 27/36
                                               428/520

(Continued)

FOREIGN PATENT DOCUMENTS

CN  102622130 A   8/2012
CN  104380232 A   2/2015
WO  2014119851 A1 8/2014

OTHER PUBLICATIONS

Chinese Office Action Report, Application No. 201610997666.8 dated Nov. 13, 2020, 17 pages.

*Primary Examiner* — Amare Mengistu
*Assistant Examiner* — Gloryvid Figueroa-Gibson
(74) *Attorney, Agent, or Firm* — Innovation Counsel LLP

(57) ABSTRACT

A display apparatus includes a first substrate, a spacer provided on the first substrate, a second substrate on the spacer, a pixel provided on the second substrate and configured to display an image, a sensing part including a first electrode provided between the first substrate and the spacer and a second electrode provided between the spacer and the pixel.

28 Claims, 16 Drawing Sheets

(51) Int. Cl.
*H01L 51/52* (2006.01)
*G06F 3/044* (2006.01)
*G02B 26/00* (2006.01)
*G02F 1/1333* (2006.01)
*G02F 1/1339* (2006.01)
*G02F 1/1343* (2006.01)
*G02F 1/1362* (2006.01)
*G02F 1/1368* (2006.01)
*H01L 51/00* (2006.01)

(52) U.S. Cl.
CPC .. *G02F 1/134336* (2013.01); *G02F 1/136286* (2013.01); *G06F 3/0416* (2013.01); *G06F 3/0445* (2019.05); *G06F 3/0446* (2019.05); *G06F 3/0447* (2019.05); *G06F 3/0448* (2019.05); *H01L 27/323* (2013.01); *H01L 51/0097* (2013.01); *H01L 51/5203* (2013.01); *H01L 51/5209* (2013.01); *H01L 51/5225* (2013.01); *G02F 1/13398* (2021.01); *G02F 2202/28* (2013.01); *G06F 2203/04102* (2013.01); *G06F 2203/04103* (2013.01); *G06F 2203/04105* (2013.01); *G06F 2203/04111* (2013.01); *H01L 2251/5338* (2013.01); *Y02E 10/549* (2013.01); *Y02P 70/50* (2015.11)

(58) Field of Classification Search
CPC ............ H01L 51/5209; H01L 51/5225; H01L 2251/5338; Y02E 10/549

USPC ......................................................... 345/174
See application file for complete search history.

(56) References Cited

U.S. PATENT DOCUMENTS

| | | | |
|---|---|---|---|
| 2009/0021666 A1* | 1/2009 | Chen | G02F 1/133305 349/58 |
| 2009/0195150 A1* | 8/2009 | Chen | G02F 1/133305 313/504 |
| 2010/0103121 A1* | 4/2010 | Kim | G02F 1/13394 345/173 |
| 2012/0242592 A1 | 9/2012 | Rothkopf et al. | |
| 2014/0184560 A1* | 7/2014 | Adachi | G06F 3/0412 345/174 |
| 2014/0204285 A1* | 7/2014 | Jang | G06F 3/0412 349/12 |
| 2014/0375570 A1* | 12/2014 | Cok | G06F 3/0416 345/173 |
| 2015/0137102 A1 | 5/2015 | Yang | |
| 2015/0338943 A1* | 11/2015 | Donnelly | G06F 3/041 345/173 |
| 2016/0066411 A1 | 3/2016 | Hong et al. | |
| 2016/0103526 A1* | 4/2016 | Sohn | G06F 3/044 345/174 |

* cited by examiner

DISPLAY APPARATUS AND MANUFACTURING METHOD THEREOF

RELATED APPLICATIONS

This application claims priority to and the benefit of Korean Patent Application No. 10-2015-0161225, filed on Nov. 17, 2015, in the Korean Intellectual Property Office, the entire contents of which are incorporated herein by reference in their entirety.

BACKGROUND

1. Field

An aspect of the present disclosure relates to a display apparatus and a manufacturing method thereof, and more particularly, to a display apparatus including a sensing part sensing a touch or a pressure of a user and a manufacturing method thereof.

2. Description of the Related Art

In general, a touch panel is arranged in an upper part of the display apparatus and may be directly touched by a hand or a material so that instructions shown on a screen of the display apparatus are selectable by the hand or the material. The display apparatus including the touch panel identifies a position at which the touch panel is touched, receives the instructions from the contact positions as an input signal and drives according to the input signal.

The use of the display apparatus including the touch panel has been increased since it does not require a separate input device, such as a keyboard or a mouse, to be connected with the display apparatus.

Recently, the touch panel is used in the display apparatus, and in this case, the touch panel is arranged in the upper part of the display panel that displays an image, receives a certain input from the user and detects position information.

SUMMARY

According to an aspect of the present disclosure, there is provided a display apparatus which embodies a thin and narrow bezel.

According to another aspect of the present disclosure, there is provided a flexible display apparatus with high reliability.

According to another aspect of the present disclosure, there is provided a manufacturing method of the display apparatus.

According to an embodiment, the display apparatus may include first substrate, a spacer provided on the first substrate, a second substrate provided on the spacer, a pixel which is provided on the second substrate and configured to display an image, and a sensing part including a first electrode provided between the first substrate and the spacer and a second electrode provided between the spacer and the pixel.

The second electrode may be provided between the second substrate and the pixel.

The second electrode may be provided between the spacer and the second substrate.

The second substrate may include a first sub-substrate and a second sub-substrate sequentially stacked, and the second electrode may be provided between the first sub-substrate and the second sub-substrate.

The first electrode may extend in a first direction when view from the plane, and the second electrode may extend in a second direction which crosses the first direction.

The first electrode may have an edge of a zigzag shape.

The first electrode may have a body extended in the first direction when viewed from the plane and a plurality of protrusions protruded to both sides in the second direction from the body. The protrusions may include first protrusions protruded from one side of the body and second protrusions protruded from another side. The first protrusions may include a first side extended outwardly from the body and a second side extended from an end portion and connected to the body, and the second protrusions may include a third side extended outwardly from the body and a fourth side extended from the end portion of the third side and connected to the body. The first and third sides may be in parallel and the second and fourth sides may be in parallel.

The first and third sides may be in parallel to the second direction, or a direction inclined against the second direction. According to an embodiment, the first to fourth sides may be inclined against the first direction.

The first and second sides may be alternately arranged on one side of the body in the first direction and the third and fourth sides may be alternately arranged on the other side of the body in the first direction.

The first electrodes may have cutting patterns at which the first and second sides adjacent to each other extending from a point meeting the body to the inside of the body when viewed from the plane, or the third and fourth sides adjacent to each other extending from the point meeting the body to the inside of the body when viewed from the plane. The cutting patterns may include the cutting patterns extending from one side of the body to the other side and the cutting patterns extending from the other side of the body to one side, and the cutting patterns extending from one side of the body to the other side and the cutting patterns extending from the other side of the body to one side may be alternately arranged in the second direction.

The first substrate may include a cutting portion provided between the first electrodes adjacent to each other when viewed from the plane. When viewed from the plane, the cutting portion may be provided along the first to fourth sides. In addition, the cutting portion may be extended to the inside of the body along the cutting pattern when viewed from the plane. An opening may be provided to the end portion of the cutting portion extended to the inside of the body. The cutting portion may be a groove recessed into a surface of the first substrate when viewed from the cross section or penetrate the first substrate when viewed from the cross section.

The second electrode may have the edge of the zigzag shape when viewed from the plane, and the second electrode may include the body extended in the second direction and the plurality of protrusions protruded from the body.

The display apparatus may have flexibility and is foldable along a folding line.

The sensing part may sense at least one of a touch or a pressure from the outside, at least one of the touch or the pressure in a direction from the first electrode to the second electrode, or at least one of the touch or the pressure from the second electrode to the first electrode direction.

The display apparatus may be provided on the pixel and further include an additional sensing part.

The first electrode may be a driving electrode and the second electrode may be a sensing electrode.

The pixel may be one of a liquid crystal device, an organic light emitting device, an electrophoretic device, and an electrowetting device.

The display apparatus may be manufactured by forming a first substrate in which a first electrode is formed, forming a second substrate in which a second electrode is formed, forming a pixel on one side of the second substrate, and attaching the first substrate to the other side of the second substrate such that the first electrode and the second electrode are spaced apart from each other with a spacer interposed therebetween.

DETAILED DESCRIPTION

Figure 1:
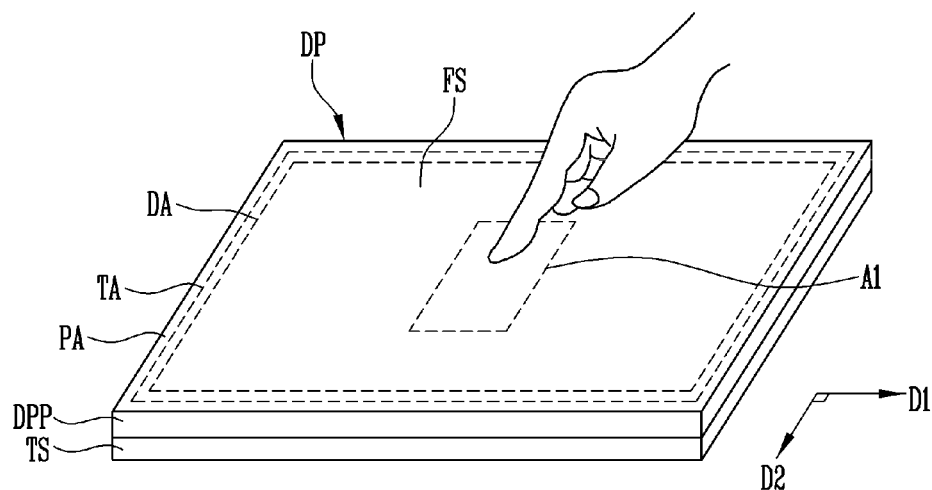
FIG. 1 is a perspective view illustrating a display apparatus according to an embodiment of the present disclosure.

Embodiments of the invention are described with reference to the accompanying figures in detail. However, the technical range of the present invention is not limited to the detailed description of the specification but defined by the range of the claims. Those of skill in the art would recognize that various changes in form and details may be made without departing from the spirit and scope of the invention as set forth in the following claims.

In the following detailed description, like reference numerals refer to like elements throughout. In the drawings, size of the structure is enlarged than it really is for clarification. The terms 'first' and 'second' are used to describe various elements, but the elements are not limited to the terms. The terms are used to distinguish one element from another element. For example, the first element may be referred to as the second element, and similarly, the second element may be referred to as the first element without departing from the spirit and scope of the present invention. Expression of the singular may include the expression of the plural unless it is explicitly different in context.

The terminology used herein is for the purpose of describing particular embodiments only and is not intended to limit the present disclosure. The terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof. Spatially relative terms may be used herein for ease of description to describe one element or feature' relationship to another element(s) or feature(s) as illustrated in the figures (e.g., parts of layers, films, regions and substrates are "on" one another and the like). The spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below.

Hereinafter, exemplary embodiments of the present disclosure are described in detail with reference to the accompanying drawings.

An embodiment of the present disclosure relates to a display apparatus configured to display an image and sense a touch of a user. The display apparatus of the embodiment senses a touch event through a hand or a stylus, or another input means, and displays or transfers image information accordingly.

Figure 2A:
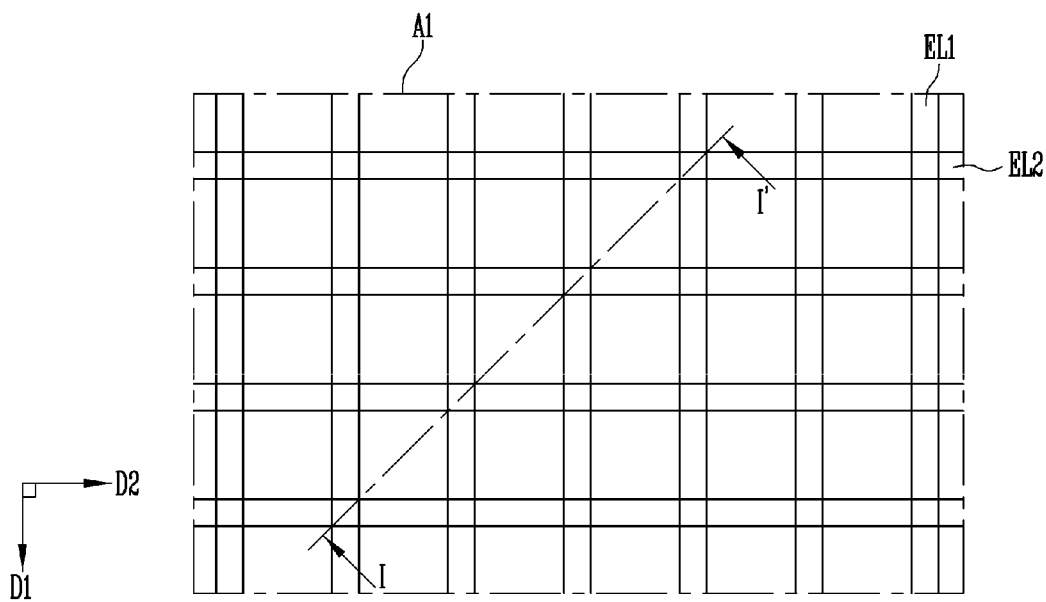
FIG. 2A is a plane illustrating an area A1 of FIG. 1.

FIG. 1 is a perspective view illustrating a display apparatus according to an embodiment of the present disclosure. FIG. 2A is a plane illustrating an area A1 of FIG. 1, and FIG. 2B is a cross-sectional view illustrating extended line I-I' of FIG. 2A.

Figure 2B:
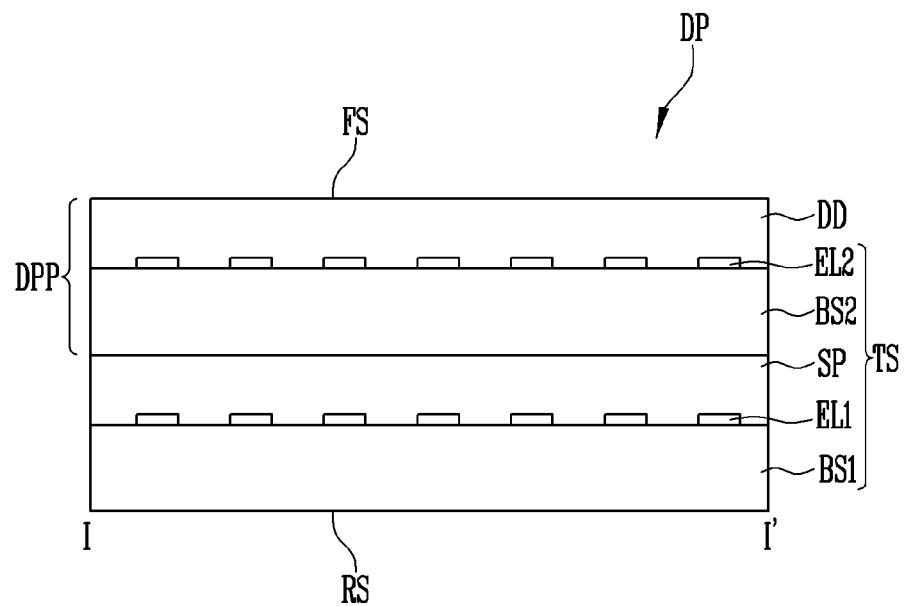
FIG. 2B is a cross-sectional view illustrating extended line I-I' of FIG. 2A.
Figure 3:
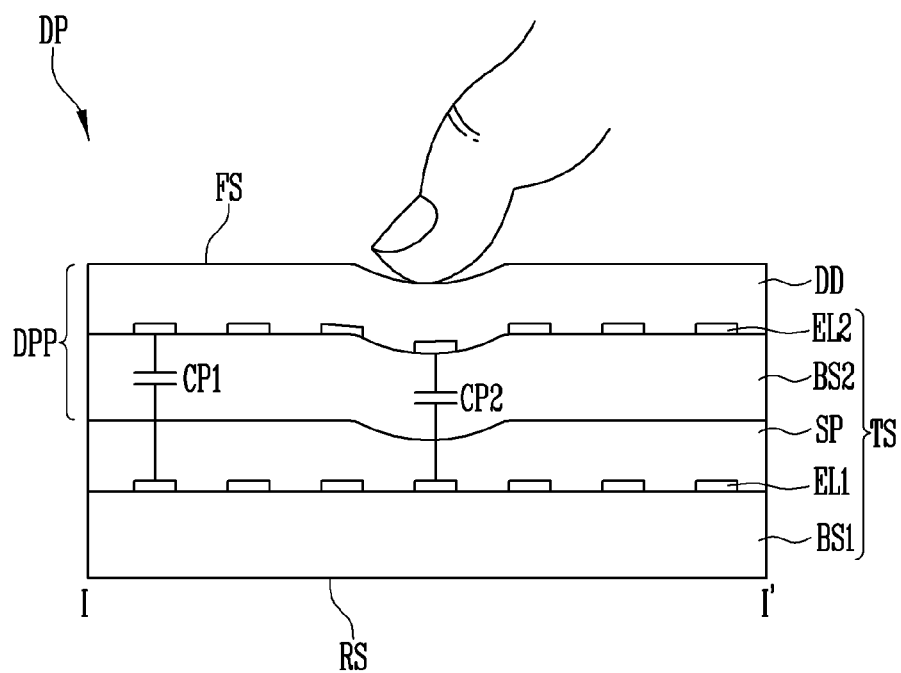
FIG. 3 is a cross-sectional view conceptually illustrating a principle of sensing a touch of a user in a display apparatus according to an embodiment of the present disclosure.

Referring to FIGS. 1, 2A and 2B, a display apparatus DP according to an embodiment may be provided in various shapes. For example, the DP may be provided in a rectangular shape including two pair of sides in parallel. When the DP is provided in a rectangular shape, one pair of sides may be provided longer than the other pair of sides. According to an embodiment, for the convenience of explanation, the display apparatus DP may be provided in a rectangular shape, which has a pair of long sides and a pair of short sides, and the extension direction of the long side is referred to as a first direction D1, and the extension direction of the short side is referred to as a second direction D2.

The display apparatus DP may include a display part DPP displaying an image and a sensing part TS. According to an embodiment, for the convenience of explanation, the side on which the image is displayed in the display apparatus DP is designated as a front surface FS, and an opposite side of the front surface is designated as a rear surface RS.

The display apparatus DP may include a display area DA in which the image generated in the display part DPP is displayed on the front surface FS, a touch area TA including the sensing part TS to sense the touch of the user or a pressure when the user touches, and a peripheral region PA provided on at least one side of the display area DA and the touch area TA. The touch area TA may overlap the display area DA, and have the substantially same or larger area than the display area DA.

For the convenience of explanation, the sensing part TS is described first and then followed by the display part DPP.

The sensing part may sense the touch or the pressure when the user touches the front surface FS. Hereafter, the touch or the pressure of the user is referred to as "touch."

The sensing part TS may be provided to the rear surface RS of the display part DPP, which is opposite to the side on which the image is displayed. The sensing part TS may share some elements with the display part DPP.

The sensing part TS may be driven as a mutual capacitance method that senses a change of the capacitance by interaction between the sensing electrodes. The sensing part TS may include a plurality of first electrodes EL1 in which a first voltage is applied and extended in one direction and a plurality of second electrodes EL2 in which a second voltage is applied and extended to the other side crossed with one side. The first electrodes EL1 and the second electrodes EL2 may be formed in the touch sensing area TA. The first electrodes EL1 and the second electrodes EL2 may be connected to a driver (not shown) of the display apparatus DP by a connecting wire (not shown) provided in the peripheral region PA.

The first electrodes EL1 and the second electrodes EL2 may extend in directions that cross each other. According to an embodiment, the first electrodes EL1 may extend in the first direction D1, and the second electrodes EL2 may extend in the second direction D2, such as exemplarily shown in FIG. 2A.

According to an embodiment, the first electrodes EL1 and the second electrodes EL2 are illustrated to have a rod shape including a width when viewed from the plane, but the present disclosure is not limited thereto, and the electrodes may have various shapes.

Hereafter, the sensing part TS according to a first embodiment is described according to a sequence of stacked body.

The sensing part TS may include a first substrate BS1, the first electrodes ELL a spacer SP, a second substrate BS2, and the second electrodes EL2 sequentially stacked.

The first substrate BS1 may be an insulating substrate formed of an organic polymer. The first substrate BS1 may be flexible. The insulating substrate material including the organic polymer may be polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, etc. However, the materials included in the first substrate BS1 are not limited thereto. For example, the first substrate BS1 may be formed of fiber glass reinforced plastic (FRP).

The first electrode EL1 may be provided on the first substrate BS1 and formed of conductive material. According to an embodiment, the first electrode EL1 may be formed of metals or an alloy thereof. The metal may be gold (Au), silver (Ag), aluminum (Al), molybdenum (Mo), chromium (Cr), titanium (Ti), nickel (Ni), neodymium (Nd), copper (Cu), platinum (Pt), etc. The first electrode EL1 may be formed as a single layer, but it is not limited thereto, and may be formed of a plurality of layers stacked with two or more metals or an alloy thereof. According to an embodiment, the first electrode EL1 may be formed of transparent conductive material. The transparent conductive material may be silver (Ag) nanowire, indium tin oxide (ITO), indium zinc oxide (IZO), antimony zinc oxide (AZO), indium tin zinc oxide (ITZO), zinc oxide (ZnO), and tin oxide (SnO2), carbon nano tube, graphene, etc. The first electrode EL1 may be formed of a single layer or a plurality of layers. In this case, the plurality of layers may include two or more of the materials above.

The spacer SP may be formed of a dielectric material and spaces apart the first electrodes EL1 from the second electrodes EL2 by a distance. Since the spacer SP may be formed of an elastic material, the spacer SP may have an elastic property that maintains a distance between the first electrodes EL1 and the second electrodes EL2 when the user is not touching the touch panel and that changes the distance between the first electrodes EL1 and the second electrodes EL2 when the user is touching the touch panel.

According to an embodiment, the spacer SP may be provided as a form shape of the organic polymer. For example, the spacer SP may be formed of polyurethane foam, ethylene vinylacetate foam, etc. However, the present disclosure is not limited thereto, and the spacer SP may be formed of another material having the elastic property applied as the dielectric material between the first electrodes EL1 and the second electrodes EL2. For example, the spacer SP may be formed of an elastomer such as polydimethylsiloxane or synthetic rubber.

The second substrate BS2 may counter to the first substrate BS1 opposite to the spacer SP. The second substrate BS2 may be an insulating substrate formed of an organic polymer and have flexibility. The second substrate BS2 may have at least one of the materials included in the first substrate BS1.

The second electrode EL2 may be provided on the second substrate BS2 and formed of a conductive material. According to an embodiment, the second electrode EL2 may be formed of metals and/or an alloy thereof, or transparent conductive material. The second electrodes EL2 may include at least one of the materials included in the first electrodes EL1.

Although not shown in the drawings, an adhesive may be provided between the first substrate BS1 in which the first electrodes EL1 are provided and the spacer SP to attach the first substrate BS1 to the spacer SP. In addition, an adhesive may be provided between the second substrate BS2 and the spacer SP to attach the second substrate BS2 to the spacer SP.

The display part DPP may display arbitrary visual information, for example, a text, a video, a picture, that is two-dimensional or three-dimensional. Hereafter, the above visual information is referred to as an "image."

The display part DPP may include at least one of display devices DD, which display the image, and the substrate in which the display device DD is included.

According to an embodiment, the substrate in which the display device DD is included is a second substrate BS2 of the sensing part TS, and in this case, the display part DD and the sensing part TS may share the second substrate BS2.

The display device DD may be provided on the second substrate BS2. The display device DD may include at least one or a plurality of pixels. The pixels may be arranged in a matrix configuration and display various images. The display device DD may be any display device that displays an image; for example, it may be a liquid crystal display, an organic light emitting display, an electrophoretic display, or an electrowetting display. For the convenience of explanation, the display device DD is exemplarily described below as an organic light emitting display. The pixel is described in the following.

The display apparatus having the structure described above according to a first embodiment may be manufactured by the method below.

Referring to FIG. 2, the display apparatus DP may be manufactured by manufacturing the first substrate BS1 in which the first electrodes EL1 are formed, manufacturing the second substrate BS2 in which the second electrodes EL2 are formed, forming the display device DD on one side of the second substrate BS2, and attaching the first substrate BS1 to the other side of the second substrate BS2 such that the first electrodes EL1 and the second electrode EL2 are spaced apart from each other with the spacers SP disposed in between.

The first substrate BS1 may be prepared, and the first electrodes EL1 may be formed on the first substrate BS1. The first substrate BS1 may be a thin and flexible substrate and formed of an organic polymer. When the first substrate BS1 is flexible, it may be difficult to handle due to its flexibility. In this case, a carrier substrate (not shown) that supports the first substrate BS1 may be provided at the bottom of the first substrate BS1 so that first electrodes EL1 may be formed effectively on the first substrate BS1. Accordingly, the first substrate BS1 may be stably supported on the carrier substrate, and the first electrodes EL1 may be formed on the upper side of the first substrate BS1.

The second substrate BS2 may be prepared separately, and the second electrodes EL2 and the display device DD may be sequentially formed on the second substrate BS2. In addition, the second substrate BS2 may be a thin and flexible substrate, in which case a carrier substrate may be provided at the bottom of the second substrate BS2 so that the second electrodes EL2 and the display device DD are formed effectively on the second substrate BS2. Accordingly, the second substrate BS2 may be stably supported on the carrier substrate, and second electrodes EL2 and the display device DD may be formed on the upper side of the second substrate BS2.

In sequence, the display apparatus DP may be manufactured by attaching the first substrate BS1 in which the first electrodes EL1 are formed to the second substrate BS2 in which the second electrodes EL2 and the display device DD are formed with the spacer SP interposed therebetween. The carrier substrate provided on the rear surface of the second substrate BS2 may be removed, and the spacer SP may be arranged to correspond to the rear surface of the second substrate BS2 in which the display device DD is not formed. An adhesive may be provided between the first substrate BS1 and the spacer SP, and between the spacer SP and the second substrate BS2. Finally, the carrier substrate provided on the rear surface of the first substrate BS1 may be removed on the rear surface of the first substrate BS1.

According to an embodiment, the first electrodes EL1 and the second electrodes EL2 adjacent to or overlapping each other may include a capacitor. One of the first electrode EL1 and the second electrode EL2 may be a driving electrode in which a driving voltage is applied, and the other of the first electrode EL1 and the second electrode EL2 may be a sensing electrode in which a sensing voltage is applied. For example, the first electrode EL1 may be the driving electrode, and the second electrode EL2 may be the sensing electrode. Alternatively, the first electrode EL1 may be the sensing electrode, and the second electrode EL2 may be the driving electrode. According to an embodiment, the electrode closer to the side on which the user touches may be the sensing electrode. Accordingly, the first electrode EL1 may be the sensing electrode, and the second electrode EL2 may be the driving electrode.

When the user is not touching the touch panel, the first electrodes EL1 and the second electrode EL2 may be spaced apart from each other by a distance with the spacer SP interposed therebetween and have a first capacitance CP1. When the user is touching the touch panel, the distance between the first electrodes EL1 and the second electrodes EL2 may be reduced by the touch pressure of the user, and the first electrodes EL1 and the second electrodes EL2 have a second capacitance CP2 smaller than the first capacitance CP1. The change of distance between the first electrode EL1 and the second electrode EL2 corresponding to an area in which the user touches the touch panel may be in proportion to a degree of touch pressure applied by the user. Accordingly, as the touch pressure applied by the user increases, the width of the first electrode EL1 and the second electrode EL2 may decrease. Accordingly, a voltage of the second electrodes EL2 may be changed, and by obtaining the change thereof, the user touch at a specific position or a degree of the touch pressure applied by the user may be recognized.

The display apparatus having the above described structure may have an advantage compared to a conventional display apparatus, which is described below.

The conventional display apparatus may be manufactured by attaching the sensing part separately on the rear surface of the display part to sense the pressure. The pressure sensor in the conventional display apparatus may include two substrates in which the first electrodes and the second electrodes are formed and the spacers provided therebetween. The sensing part may be attached to the rear surface of the display part by applying an adhesive (e.g., a pressure sensitive adhesive).

Accordingly, the conventional display apparatus may require a base substrate to form the display part and two substrates to form the sensing electrodes. As such, when attaching the sensing part separately provided in the display apparatus, the thickness of the display apparatus may increase.

Further, the two substrates forming the sensing electrodes may be printing circuit substrates in general. In this case, the thickness of a wire formed on the printing circuit substrate may be relatively thicker than that of a wire provided in the pixel. Accordingly, line width of the connecting wire formed on the printing circuit substrate may be relatively greater and require a wide peripheral region.

In contrast to the conventional display apparatus, the second substrate in the display apparatus according to the first embodiment may be shared by the sensing part and the display part. That is, the second substrate may be used to include the second electrodes of the sensing part and display devices of the display part. Accordingly, the thickness of the display apparatus compared to the conventional invention may be reduced.

In addition, according to an embodiment, since the second electrodes and the connecting wire thereof may be formed on the second substrate in which the display devices are formed, and the connecting wire is relatively narrowly formed, such as the line width of the wires used in the display device, the peripheral area may be minimized. As a result, a display apparatus with a narrow bezel may be embodied.

Figure 4:
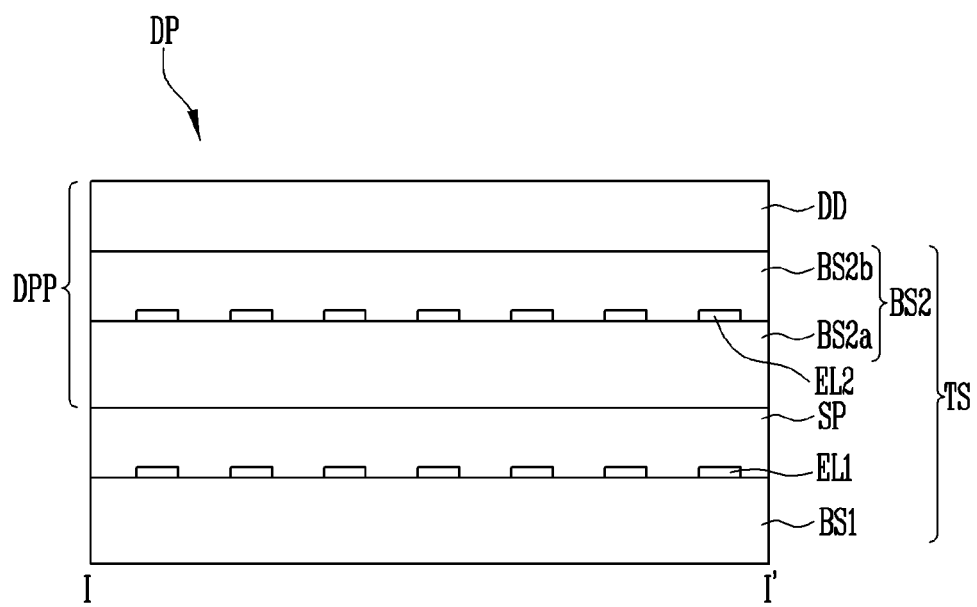
FIG. 4 is a cross-sectional view taken along the line I-I' of FIG. 2A illustrating a display apparatus according to a second embodiment of the present disclosure.

According to an embodiment, the configuration in which the display part and the sensing part share the second substrate may be formed in various shapes, and the configuration is not limited to the structure described above. FIG. 4 is a cross-sectional view taken along the line I-I' of FIG. 2A illustrating a display apparatus according to a second embodiment of the present disclosure.

Hereafter, in order to avoid redundancy of explanation, parts different from the first embodiment described above are described. In addition, the same reference numerals are applied to substantially the same configuration elements, and the parts of the second embodiment that are not explained in detail may be substantially the same as those of the first embodiment described above.

Referring to FIG. 4, the display apparatus DP according to the second embodiment may include the display part DPP and the touch sensing TS. The touch sensing TS may be provided to the rear surface of the display part DPP opposite to the side in which the image is displayed.

The sensing part TS may include a sequential stack of the first substrate BS1, the first electrodes EL1 the spacer SP, the second substrate BS2, and the second electrodes provided in the second substrate BS2.

The first substrate BS1, the first electrodes EL1 and the spacer SP may be substantially the same as the embodiment described above, so that the description is omitted.

The second substrate BS2 may counter to the first substrate BS1 with the spacer SP interposed therebetween. The second substrate BS2 may be an insulating substrate formed of an organic polymer, and include one of the materials included in the first substrate BS1.

The second substrate BS2 may include a first sub-substrate BS2a and a second sub-substrate BS2b sequentially stacked. The first sub-substrate BS2a and the second sub-substrate BS2b may be an insulating substrate formed of organic polymers and include one of the materials that is included in the first substrate BS1.

The second electrodes EL2 may be provided in the inside of the second substrate BS2, in more detail, between the first sub-substrate BS2a and the second sub-substrate BS2b.

The second electrodes EL2 may be formed of conductive materials. According to an embodiment, the second electrodes EL2 may be formed of metals and/or an alloy thereof, or the transparent conductive material. The second electrodes EL2 may include one of the materials included in the first electrode EL1.

The display part DPP may include the display device DD, which displays the image, and the substrate in which the display device DD is included. According to an embodiment, the substrate in which the display device DD is included may be the second substrate BS2 of the sensing part TS, and the second substrate BS2 may be shared by the display part DPP and the touch sensing TS. That is, the substrate in which the display device DD is included may correspond to the collective of the first sub-substrate BS2a, the second electrodes EL2 disposed thereon, and the second sub-substrate BS2b.

The display device DD may be provided on the second substrate BS2. In more detail, the display device DD may be provided on the second sub-substrate BS2b. The display device DD may include a plurality of pixels, and the pixels may be arranged in a matrix configuration and display various images.

The display apparatus DP having the structure described above according to the second embodiment may be manufactured by the same method.

Referring to FIG. 4, the display apparatus DP may be manufactured by manufacturing the first substrate BS1 in which the first electrodes EL1 are formed, manufacturing the second substrate BS2 in which the second electrodes EL2 are formed, forming the display device DD on one side of the second substrate BS2, and attaching the first electrode BS1 to the other side of the second substrate BS2 such that the first electrodes EL1 and the second electrode EL2 are spaced apart from each other with the spacer SP interposed therebetween.

The first substrate BS1 may be disposed, and the first electrodes EL1 may be formed on the first substrate BS1.

Separately, the second substrate BS2 in which the second electrodes EL2 are formed may be prepared. The second substrate BS2 may be manufactured by forming the second sub-substrate BS2b on the first sub-substrate BS2a in which the second electrodes EL2 are formed after forming the second electrodes EL2 on the first substrate BS1a.

The first sub-substrate BS2a and the second sub-substrate BS2b may be thin and flexible substrates and formed of an organic polymer. In this case, the carried substrate (not shown) may be provided at the bottom of the first sub-substrate BS1a and the second sub-substrate BS2b to provide stable support. Accordingly, the first sub-substrate BS2a may be formed on the carrier substrate, and the second electrodes EL2 may be formed while the first sub-substrate BS2a is supported on the carrier substrate, and the second sub-substrate BS2b may be formed on the first sub-substrate BS2a in which the second electrodes EL2 are formed. The display device DD may be formed on the second sub-substrate BS2b supported on the carrier substrate.

In sequence, the display apparatus DP may be manufactured by attaching the first substrate BS1 in which the first electrodes EL1 are formed to the second substrate BS2 in which the second electrodes EL2 and the display device DD are formed with the spacer SP interposed therebetween. The carrier substrate provided on the rear surface of the second substrate BS2 may be removed, and the spacer SP may be arranged to correspond to the rear surface of the second substrate BS2 in which the display device DD is not formed. An adhesive may be provided between the first substrate BS1 and the spacer SP, and between the spacer SP and the second substrate BS2. Finally, the carrier substrate provided on the rear surface of the first substrate BS1 may be removed from the rear surface of the first substrate BS1.

Compared to this, in the display apparatus according to the second embodiment, the second substrate may be shared by the sensing part and the display part. Accordingly, the thickness of the display apparatus may be reduced in comparison to the conventional display apparatus. In addition, since the connecting wire is relatively narrowly formed, such as the line width of the wires used in the display device, the peripheral area may be minimized.

Figure 5:
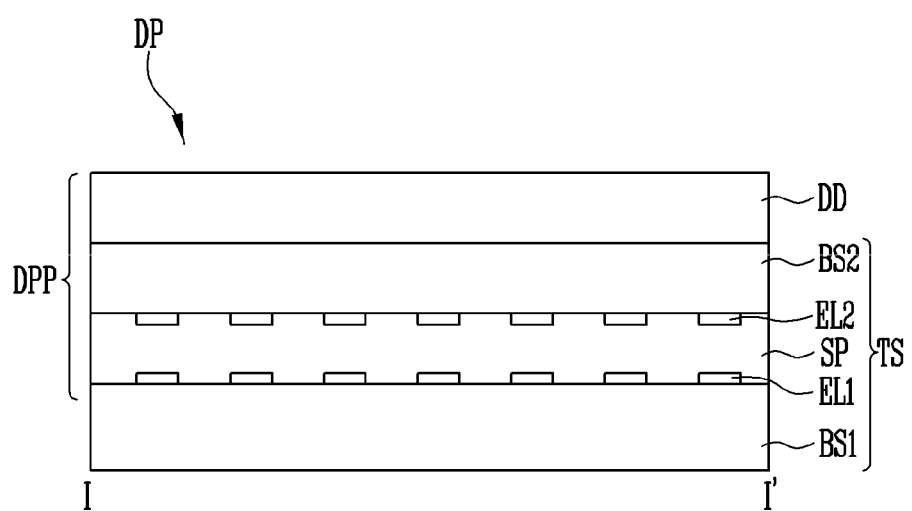
FIG. 5 is a cross-sectional view taken along the line I-I' of FIG. 2A illustrating a display apparatus according to a third embodiment of the present disclosure.

FIG. 5 is a cross-sectional view taken along the line I-I' of FIG. 2A illustrating a display apparatus according to a third embodiment of the present disclosure.

Referring to FIG. 5, the display apparatus DP according to a third embodiment may include a display part DPP and a sensing part TS.

The sensing part may include a sequential stack of the first substrate BS1, the first electrodes EL1 the spacer SP, second electrodes EL2 and the second substrate BS2.

The first substrate BS1, the first electrodes EL1 and the spacer SP may be substantially the same as the embodiment described above. As such, a description thereof is omitted.

The second substrate BS2 may counter to the first substrates BS1 with the spacer SP interposed therebetween. The second substrate BS2 may be an insulating substrate formed of an organic polymer and include at least one of the materials formed of the first substrate BS1.

The second electrodes EL2 may be provided on the rear surface of the second substrate BS2. That is, the second electrodes EL2 may be provided between the second substrate BS2 and the spacer SP.

The display part DPP may include the display device DD and the substrate in which the display device DD is included. According to an embodiment, the substrate in which the display device DD is included may be the second substrate BS2 of the sensing part TS, and in this case, the display part DPP and the sensing part TS may share the second substrate BS2.

As the first and second embodiments described above, in the display apparatus according to the third embodiment, the second substrate may be shared by the sensing part TS and the display part DPP. Accordingly, the thickness of the display apparatus may be reduced in comparison to the conventional display apparatus. In addition, the peripheral area may be minimized since the connecting wire may be formed relatively narrowly such as the line width of the wires used in the display device DD.

The display apparatus DP according to the third embodiment having the structure described above may be manufactured by the method as follows.

Referring to FIG. 5, the display apparatus DP may be manufactured by manufacturing the first substrate BS1 in which the first electrodes EL1 are formed, forming the second electrodes EL2 on the second substrate BS2 in which the display device DD is formed, and attaching the first substrate BS1 on another side of the second substrate BS2 such that the first electrodes EL1 and the second electrodes are spaced apart from each other with the spacer SP interposed therebetween.

The first substrate BS1 may be prepared, and the first electrodes EL1 may be formed on the first substrate BS1. A carrier substrate (not shown) may be provided at the bottom of the first substrate BS1 to provide support thereto.

The second substrate BS2 is prepared separately, and the display device DD may be formed on the second substrate BS2. The second substrate BS2 may be a thin and flexible substrate formed of an organic polymer. In this case, a carrier substrate (not shown) to stably support the second substrate BS2 may be provided at the bottom side. Accordingly, the second substrate BS2 may be formed on the carrier substrate, the display apparatus DD may be formed on the front surface while the second substrate BS2 is supported on the carrier substrate.

The second substrate BS2 in which the display device DD is formed may be arranged on the carrier substrate after being separated and reversed from the carrier substrate. Accordingly, the rear surface of the second substrate BS2, that is, the side in which display device DD is not formed may be exposed. The second electrodes EL2 may be formed on the rear surface RS of the second substrate BS2.

The display apparatus DP may be manufactured by attaching the first substrate BS1 in which the first electrodes EL1 are formed to the second substrate BS2 in which the second electrodes EL2 and the display device DD are formed with the spacer SP interposed therebetween. The spacer SP may be arranged to correspond to the rear surface of the second substrate BS2, that is, the side in which the display device DD is not formed. An adhesive may be provided between the first substrate BS1 and the spacers SP, and between the spacer SP and the second substrate BS2.

Hereafter, the carrier substrates to support the first substrate BS1 the second substrate BS2 may be removed.

Figure 6:
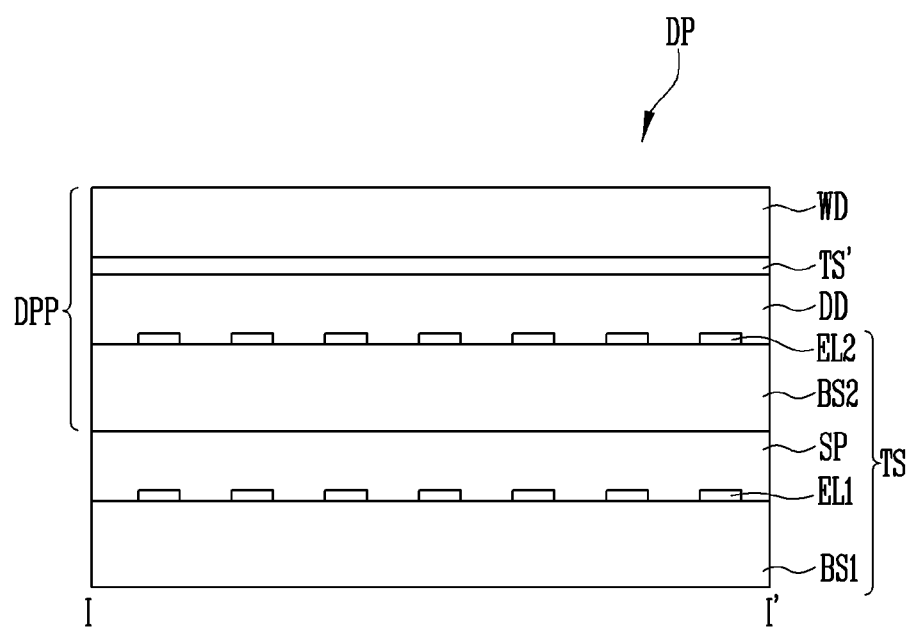
FIG. 6 is a cross-sectional view taken along the line I-I' of FIG. 2A illustrating a display apparatus according to a fourth embodiment of the present disclosure.

The display apparatus of the present disclosure may further include further configuration elements for further function besides the display part DPP and the sensing part TS. For example, the display apparatus may further include an additional sensing part that selectively senses the touch of the user and a window for protecting the display part. FIG. 6 is a cross-sectional view taken along the line I-I' of FIG. 2A illustrating a display apparatus according to a fourth embodiment of the present disclosure.

Referring to FIGS. 2A and 6, the display apparatus DP according to the fourth embodiment of the present disclosure may include the display part DPP and the sensing part TS.

The sensing part TS may include a sequential stack of the first substrate BS1, the first electrodes EL1, the spacer SP, second substrate BS2, and the second electrodes EL2. According to an embodiment, the stacking sequence of the sensing part TS may be the same as the first embodiment.

The display apparatus DPP may include the second substrate BS2, the display device DD included in the second substrate BS2, an additional sensing part TS' and a window WD provided on the display device DD. The window WD is provided on the additional sensing part TS'.

The additional sensing part TS' may be used to detect the touch of the user. In this case, the sensing part TS may mainly sense the touch or the pressure of user touches, while the additional sensing part TS' may mainly sense the touch of the user. The additional sensing part TS' may sense the touch and the type thereof but is not limited thereto. For example, the additional sensing part TS' may utilize a capacitance method, such as a mutual capacitance method that senses the change of the capacitance of the interaction between two sensing electrodes, or a self-capacitance method that senses the change of the capacitance of the sensing electrode.

The window WD may protect the additional sensing part and the display device DD provided on the front surface of the display device DD, that is, the side in which the image is provided. The window WD may protect the display apparatus DP from external stress and shock and may be arranged outside of the upper side to protect the display apparatus DP.

Although not illustrated, the sensing part TS may further comprise a protecting film attached on the rear surface of the first substrate BS1. The protecting film may be arranged to counter to the first substrate BS1 of the sensing part TS with an adhesive interposed therebetween and in the outmost of lower part of the display apparatus so that it protects the display apparatus DP from external stress and shock from the outside.

The additional sensing part TS', the window WD and the protecting film may be selectively employed or omitted. In other words, according to an embodiment, the window WD and the protecting film may be included in the display apparatus DP without the additional sensing part TS', and the additional sensing part TS' may be included without the protecting film in another embodiment of the present disclosure.

As described above, according to the fourth embodiment of the present disclosure, the display apparatus may further include the additional elements, such as the additional sensing part and the window, in addition to those of the first embodiment, but it is not limited to the described structure. For example, according to another embodiment, the sensing part TS may be provided in the same configuration as the second and third embodiments.

According to an embodiment, at least a part of the display apparatus may have flexibility and may be foldable or not in the part having the flexibility.

Figure 7:
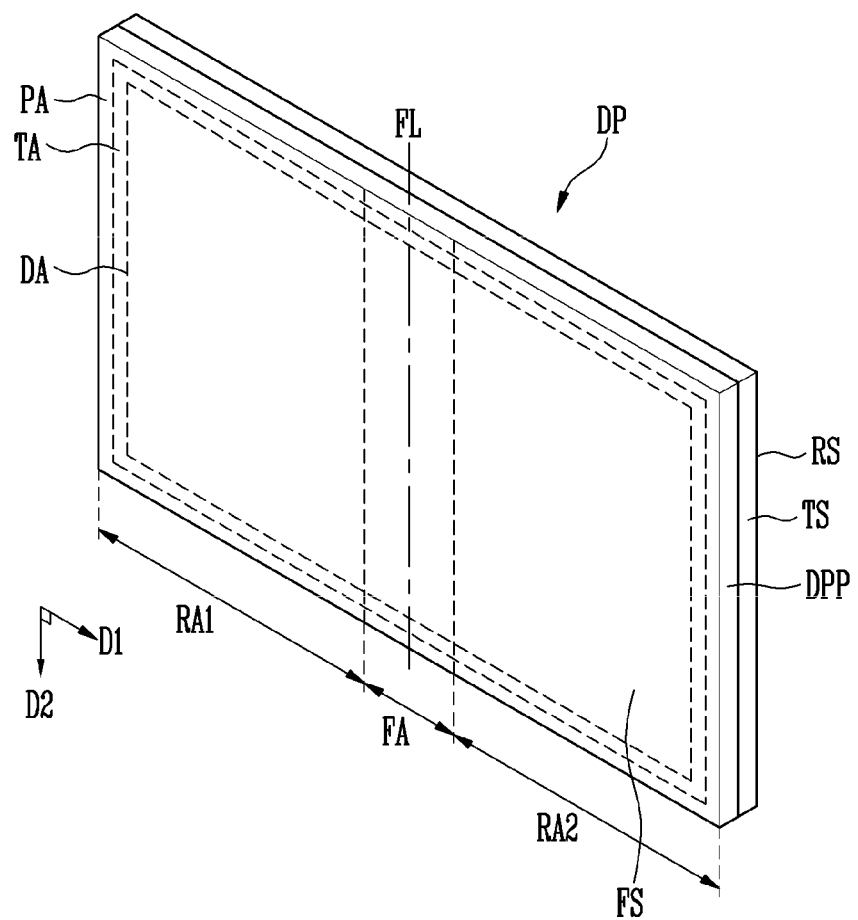
FIG. 7 is a perspective view illustrating a display apparatus according to an embodiment of the present disclosure.
Figure 8A:
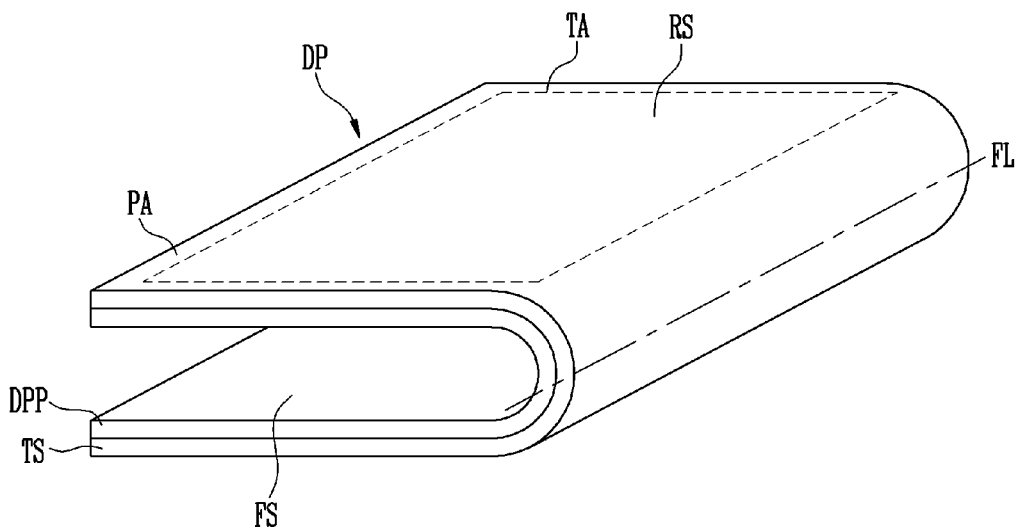
FIG. 8A is a perspective view of a foldable display apparatus in its folded state.

FIG. 7 is a perspective view illustrating a display apparatus according to an embodiment of the present disclosure. FIG. 8A is a perspective view of the display apparatus when it is folded, and FIG. 8B is a cross-sectional view of the display apparatus in FIG. 7 when it is folded.

Figure 8B:
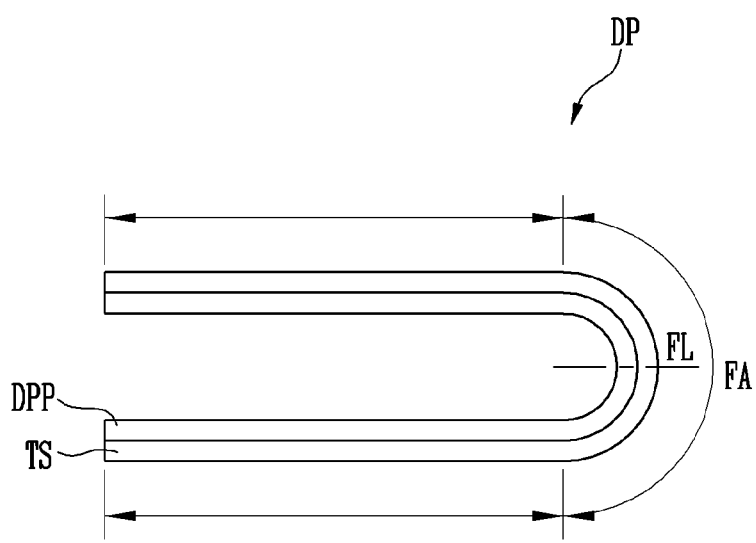
FIG. 8B is a cross-sectional view of the display apparatus in its folded state

Referring to FIGS. 7, 8*a* and 8*b*, the display apparatus DP may include the display area DA in which the image is displayed in the front surface, the touch area TA sensing the touch of the user, and the peripheral area PA provided on at least one side of the display area DA and the touching area. TA. In addition, according a degree of flexibility, the display apparatus DP may have a flexible area FA having flexibility and a rigid area RA provided on at least one side of the flexible area FA and not having flexibility. When an imaginary line in which the display apparatus having flexibility is foldable along a folding line FL, the folding line FL may be provided in a flexible area FA. According to an embodiment, the folding line may pass the center of the flexible area FA, and the flexible area FA is a line of symmetry with respect to the flexible area FA but it is not limited thereto. In other words, the folding line may be provided unsymmetrically in the flexible area FA.

The term "foldable" means that original shape may be changed to another shape, and the display apparatus may be folded along one or more particular lines. That is, the display apparatus may be foldable along the folding line FL or in a curve shape or a roll type. Accordingly, the display apparatus may have flexibility in the flexible area FA but may or may not be foldable in practice.

According to an embodiment, the sides in the rigid area may be arranged in parallel and foldable to be opposite to each other, but it is not limited thereto, and the sides of the rigid area may have an angle (for example, a right angle, an acute angle, or an obtuse angle) with the flexible area FA interposed therebetween.

In addition, in the flexible area FA and the rigid areas RA1 and RA2, the terms "flexible" or "not flexible", and "flexible" or "rigid" refer to the relative characteristics of the display apparatus DP. In other words, the expressions of "not flexible" and "rigid" mean not only rigid state without the flexibility, but also less flexibility than the flexible area FA. Accordingly, in the rigid areas RA1 and RA2, the flexibility provided may be relatively less than the flexible area FA or may not be provided. Even in the condition that the flexible area FA is foldable, the rigid areas RA1 and RA1 may be not foldable.

An embodiment of the present disclosure discloses a first rigid area RA1, the flexible area FA, and the second rigid area RA2 sequentially arranged in a first direction D1. The flexible area FA may extend in the second direction D2.

According to the display apparatus DP, the folding line FL may be provided in the flexible area FA in the second direction D2, which is the extension direction of the flexible area FA. Accordingly, the display apparatus DP may be foldable in the flexible area FA. In an embodiment of the present disclosure, the first and second rigid areas RA1 and RA2 may be arranged opposite to each other after the display apparatus DP is folded in the flexible area FA along the folding line FL.

According to an embodiment, the display apparatus DP may be foldable such that, when folded, its front surfaces FS oppositely face each other. According to an embodiment, the display apparatus DP may be foldable such that, when folded, its rear surfaces RS oppositely face each other.

When the front surfaces FS of the display apparatus DP are folded to be opposite to each other, the rear surfaces RS are exposed to the outside. According to an embodiment, the peripheral area PA may be provided at least in a touching area or on one side of the touching area TA on the rear surface RS. Accordingly, the foldable display apparatus may sense the touch of the user when the user touches the display apparatus DP.

According to an embodiment, for the convenience of explanation, it is illustrated that the first and second rigid areas RA1 and RA2 may have the area same as each other, and the flexible areas FA may be arranged between rigid areas RA, but it is not limited thereto. For example, the first and second rigid areas RA1 and RA2 may have areas different from each other. In addition, it is not required to be two rigid areas RA1 and RA2, and one or three or more flexible regions may be provided. In this case, a plurality of rigid areas RA may interpose the flexible area FA such that the plurality of rigid areas RA may be provided to be spaced apart from each other.

In an embodiment of the present disclosure, the folding line FL, the flexible area FA, and the rigid area RA may be changed in various shapes. For example, in the embodiment of the present disclosure, the folding line FL may be provided a single line, but it is not limited thereto; a plurality of folding line FL may be provided. In addition, FIG. 9A is a perspective view illustrating a foldable display apparatus that is folded along a plurality of folding lines FL.

Figure 9A:
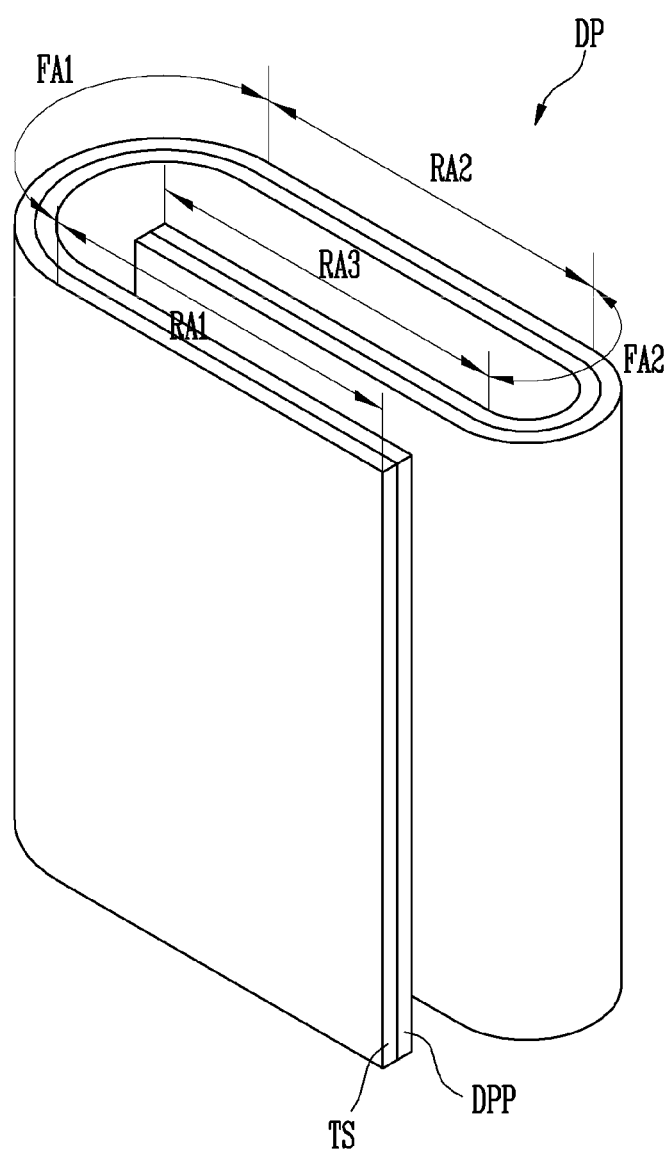
FIG. 9A is a perspective view illustrating a foldable display apparatus folded along a plurality of folding lines are provided.

Referring to FIG. 9A, according to the embodiment, two folding lines may be provided, and a first rigid area RA1, a first flexible area FA1, a second rigid area RA2, a second flexible area FA2, and a third rigid area RA3 may be sequentially arranged in the first direction D1. The first flexible area FA1 and the second flexible area FA2 may extend along one side corresponding to the folding lines.

The display apparatus DP may be folded in the first flexible area FA1 and the second flexible area FA2. In the drawings of the embodiment, the third rigid area RA3 may be folded to be arranged between the first rigid area RA1 and the second rigid area RA2, but it is not limited thereto. For example, in another embodiment of the present disclosure, the second rigid area RA2 may be foldable to be arranged between the first rigid area RA1 and the third rigid area RA3.

Figure 9B:
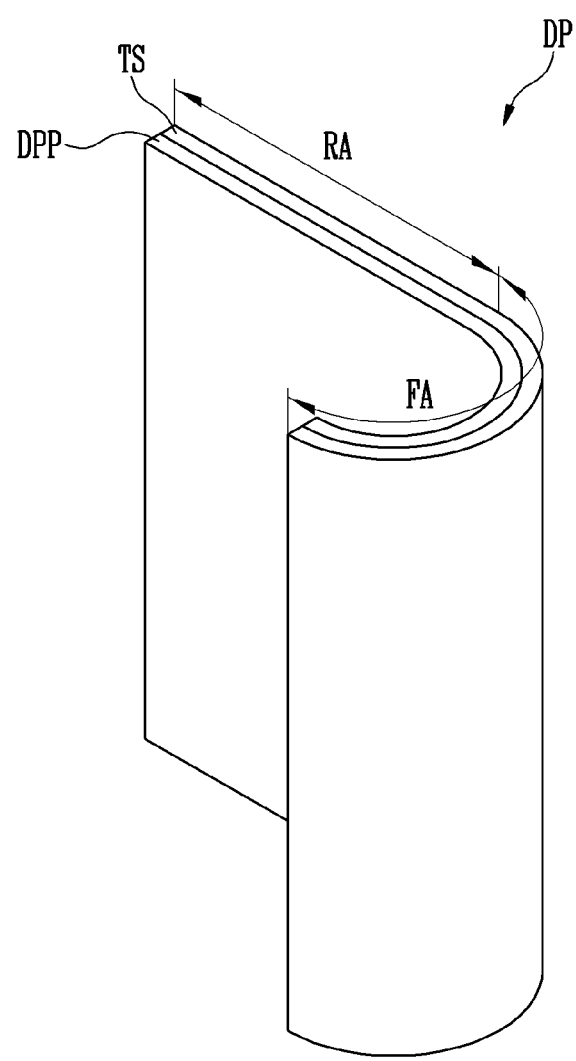
FIG. 9B is a perspective view illustrating the display apparatus of FIG. 9A in a partially rolled state.

In addition, in the embodiment of the present disclosure, a part of the display apparatus DP is foldable in a roll type by providing the flexible area FA on one side of the display apparatus DP. FIG. 9B is a perspective view illustrating a part of the display apparatus DP foldable in the roll type.

Although the display apparatus DP according to the embodiment described above may include the rigid area RA and the flexible area FA, the display apparatus DP may be formed of the flexible area FA without the rigid area RA. In this case, the folding line FL may be provided in various positions as necessary and rolled in the roll type.

Accordingly, the sensing part TS may receive great stress by the tension applied to the flexible direction. In the display apparatus DP according to an embodiment, the sensing part TS, more particularly, the first substrate and the first electrodes have structures that are able to withstand the stress.

According to an embodiment, when the display apparatus DP is bending, folding, or rolling due to its flexibility display apparatus, the stress may be applied to the rigid area RA. In other words, when the display apparatus is bending folding, and rolling, the center of the curvature of the flexible part may be arranged on the front surface in which the image is displayed, or in the rear surface. When the center of the curvature is arranged in the front surface, the sensing part TS, more particularly, the first substrate and the first electrodes, may be substantially arranged in the outmost display apparatus DP. Accordingly, the sensing part TS may receive the great stress caused by the tension applied in the flexible direction. In the display apparatus according to an embodiment, the sensing part TS, more particularly, the first substrate and the first electrodes, has a structure that is strong enough to withstand the tension.

Hereafter, configurations of the first and second electrodes according to the embodiments are described.

Figure 10A:
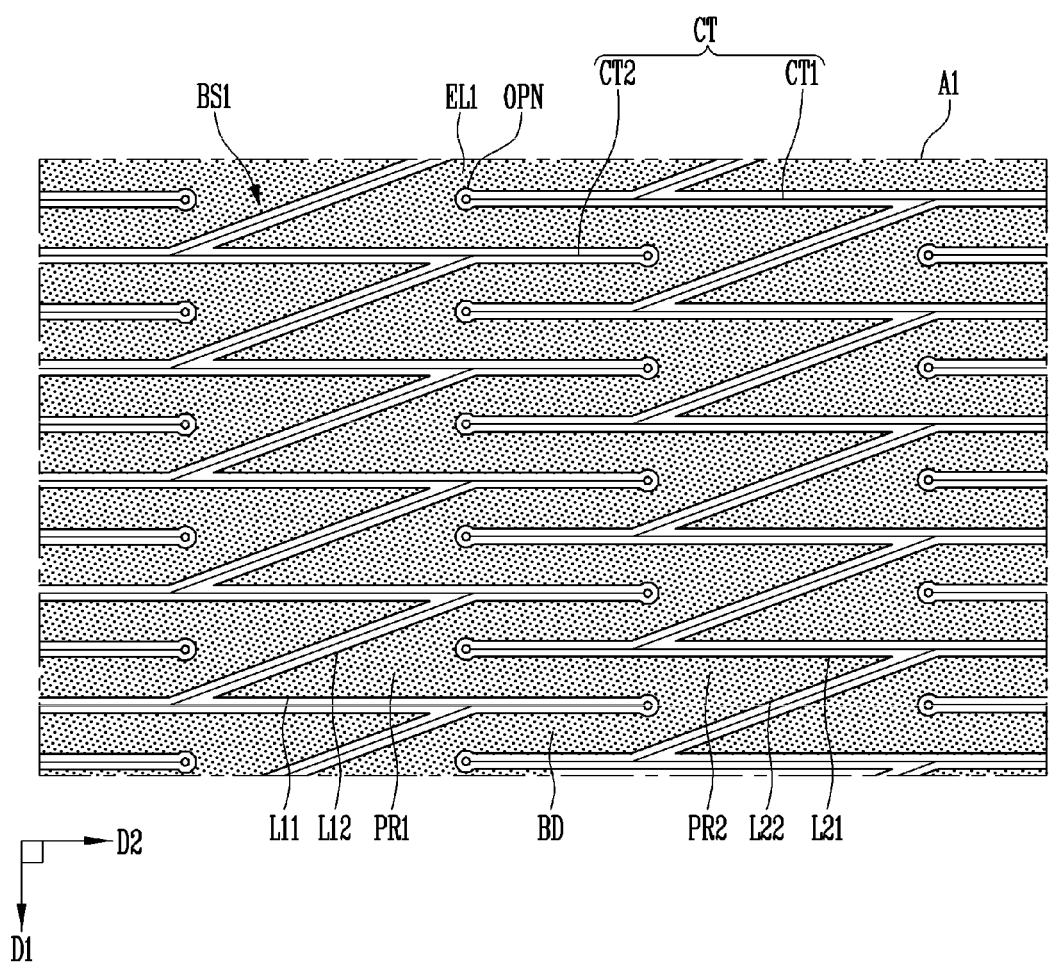
FIG. 10A is a plane view illustrating first electrodes in an area A1 of FIG. 1 according to an embodiment of the present disclosure.
Figure 10B:
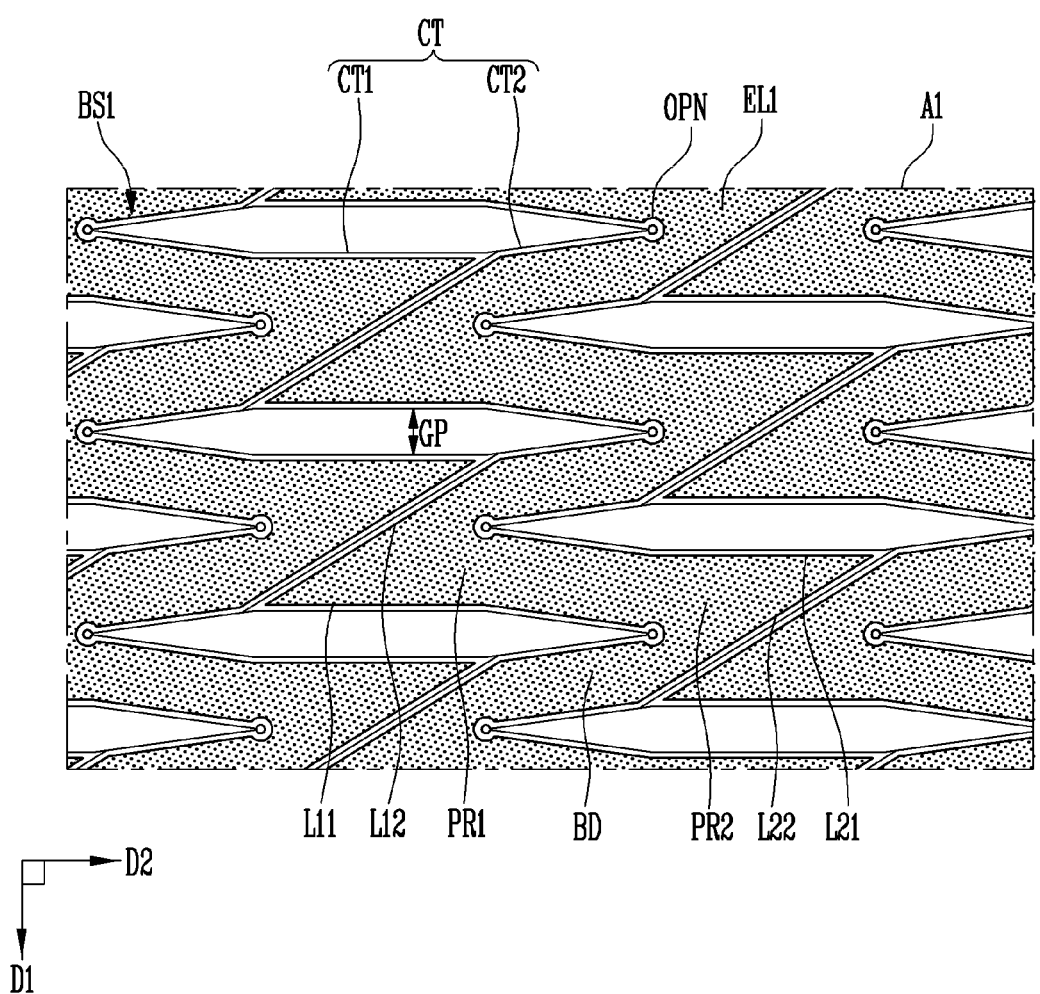
FIG. 10B is a plane view illustrating first electrodes extending in a certain direction.

FIG. 10A is a plane view illustrating first electrodes in an area A1 of FIG. 1 according to an embodiment of the present disclosure. FIG. 10B is a plane view illustrating first electrodes extending in a certain direction.

Hereafter, according to an embodiment, the width between the first electrodes EL1 in the drawings is illustrated larger than the width of a cutting portion CT (shown in the line in the drawings). In other words, the first electrodes EL1 may be spaced apart from each other at a distance in which the first electrodes EL1 are adjacent to each other and the cutting patterns are formed, and cutting portion is formed in the distance spaced apart from each other. It is illustrated that the first electrodes EL1 are spaced apart from each other, and the cutting portion CT may be formed within the distances spaced apart from each other.

However, to explain easily positions of the first electrodes ELL the first substrate BS1 and the cutting portion CT, and the edge, and the cutting pattern of the first electrodes EL1 may be substantially the same as the cutting portion CT. Accordingly, the edge and the cutting patterns of the first electrodes EL1 may overlap the cutting portion when viewed from the plane.

However, according to another embodiment, the first electrodes and the cutting portion CT may be formed differently, and the distance between the first electrodes may be spaced larger than that of the cutting portion CT.

Referring to FIG. 10A, the first electrodes EL1 may extend in the first direction D1 when viewed from the plane, and the edge of the first electrodes EL1 may be in the zigzag shape. When the direction in which the first electrodes EL1 are extended is a length direction, and the direction which crosses the length direction is a width direction, the first electrodes EL1 may have a body BD that extends in the first direction D1 and a plurality of protrusions protruded from the body BD to the width direction.

The length direction may be in parallel to the first direction D1, and the width direction may be in parallel to the second direction D2. However, the length direction may be opposite to the first direction D1. The length direction in which the first electrodes EL1 are extended may be changed along a stress direction in which the stress is applied to the display apparatus. For example, when the folding line FL of the display apparatus according to an embodiment is in parallel to the first direction D1, the length direction in which the first electrodes extend may be the second direction D2.

The protrusions may have first protrusions PR1 protruded from one side of the body BD in the width direction and second protrusions PR2 protruded from the other side.

Each protrusion may have a polygonal shape protruded from the body BD. For example, each protrusion may be provided as a triangular shape. For example, each of the first protrusions PR1 may have a first side L11 extended from the body BD to the outside in parallel to the width direction, a the second side L12 extended from the end portion of the first side L11 and connected to the body BD. The second side L12 may be arranged to be inclined against to the width direction. Each of the second protrusions PR2 may include the third side L21 extended from the body BD to the outside in parallel to the width direction and the fourth side L22 extended from the third side L21 and connected to the body BD. The fourth side L22 may have the fourth side L22 extended to be inclined against to the width direction.

In the first protrusions PR1, the first sides L11 and the second sides L12 may be alternately arranged on one side of the body BD in the first direction D1. In the second protrusions PR2, the third sides L21 and the fourth sides L22 may be alternately arranged on the other side of the body BD in the first direction D1. According to an embodiment, the first sides L11 and the third lines L21 may be in parallel to the second direction D2. An inclining angle between the second sides L12 and the fourth sides L22 from the width direction may be the same as each other. Accordingly, the second sides L12 and the fourth sides L22 may be in parallel.

The first electrodes EL1 may have the cutting pattern extended toward the body BD from a point at which the first side L11 and the second side L12 adjacent to each other meet the body BD. The cutting pattern may be extended when pulled over from both sides in the direction in which the first electrodes EL1 are parallel to the first direction D1. In general, the cutting patterns may extend in the direction parallel to the width direction, which is the second direction D2. The cutting patterns do not intersect the first electrodes EL1 in order not to separate the first electrodes EL1 in the first direction.

The cutting patterns may be extended from one side of the body BD to the other side, and extended from the other side to the one side of the body BD. The cutting patterns may be extended from one side of the body BD to the other side, and the cutting patterns extended from the other side to the one side of the body BD may be alternately arranged in the first direction D1.

The first substrate BS1 may have the cutting portion CT corresponding to the distance between the first electrodes EL1 adjacent to each other and the cutting patterns. When viewed from the cross section, the cutting portion CT may be the part in which at least a part of first substrate is cut. According to an embodiment, the cutting portion CT may penetrate the first substrate BS1 when viewed from the cross section, and be a groove extended from the rear surface to the front surface of the first substrate BS1.

According to an embodiment, an opening pattern in a circle or polygonal shape may be provided in the cross-sectional unit of the cutting patterns extended to the body BD. The opening pattern is for dispersing the stress.

The cutting portion CT may have a first cutting portion CT1 formed along the edge provided in a zigzag shape between the first electrodes EL1 adjacent to each other when viewed from the plane. In other words, the first cutting portion CT1 may be provided along to the first sides L11 and the fourth sides L22 when viewed from the plane.

The cutting portion CT may extend from the point at which the first side L11 and the second side L12 adjacent to each other meet the body BD toward the direction of the body BD when viewed from the plane, or further include a second cutting portion CT2 extending from the point at which the third side L21 and the fourth side L22 adjacent to each other meet the body BD toward the direction of the body BD. The second cutting portion CT2 may correspond to the cutting patterns formed in the first electrodes EL1. The second cutting portion CT2 may be parallel to the width direction, which is the second direction D2.

According to an embodiment, an opening OPN in the circle and polygonal shape in the end portion of the second cutting portion CT2. The opening OPN may disperse the stress received by the end portion of the cutting portion CT to the surroundings.

FIG. 10B is a plane view illustrating the extended first electrodes and first substrate when a tension is applied to both sides in which the first electrodes are parallel to the first direction.

Referring to FIG. 10B, the display apparatus including the structure described above may be changed in the shape in which the cutting patterns and the cutting portion CT' are open when the tension is applied from the direction. More particularly, the first cutting portion CT1 and the second cutting portion CT2 may be open to the direction in which the tension is applied, such that a gap GP is formed, and disperse the stress applied to the first electrodes EL1. As a result, the damage of the first electrodes EL1 may be minimized.

According to an embodiment described above, the extension may be performed toward both sides parallel to the first direction, and the tension is applied to the direction parallel to the first direction accordingly. However, the extension may be performed to both sides parallel to the second direction. In this case, the cutting patterns and the cutting portion may be open. Specifically, when the extension is performed to the direction parallel to the second direction, the first cutting portion may be open to the direction in which the tension is applied such that the gap is formed, and the tension applied to the first electrodes may be dispersed. As a result, the damage of the first electrodes EL1 may be minimized.

According to an embodiment, unlike the embodiment described above, when the first substrate and the first electrodes EL1 are compressed to the first direction, the first electrodes arranged on both sides of the first and second cutting portions may be changed in the direction to be closer each other, so that damage of the first electrodes may be minimized.

Figure 11A:
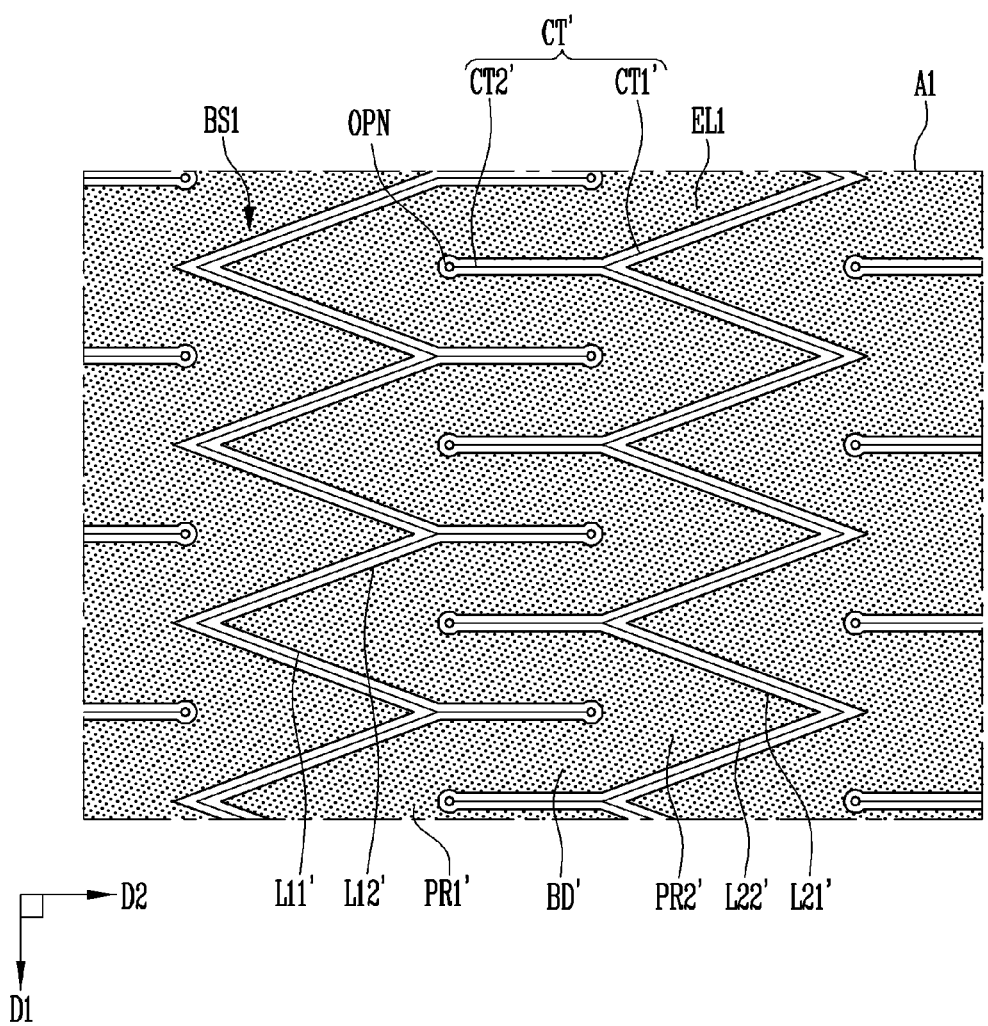
FIG. 11A is a plane view illustrating first electrodes in an area A1 of FIG. 1 according to another embodiment of the present disclosure.
Figure 11B:
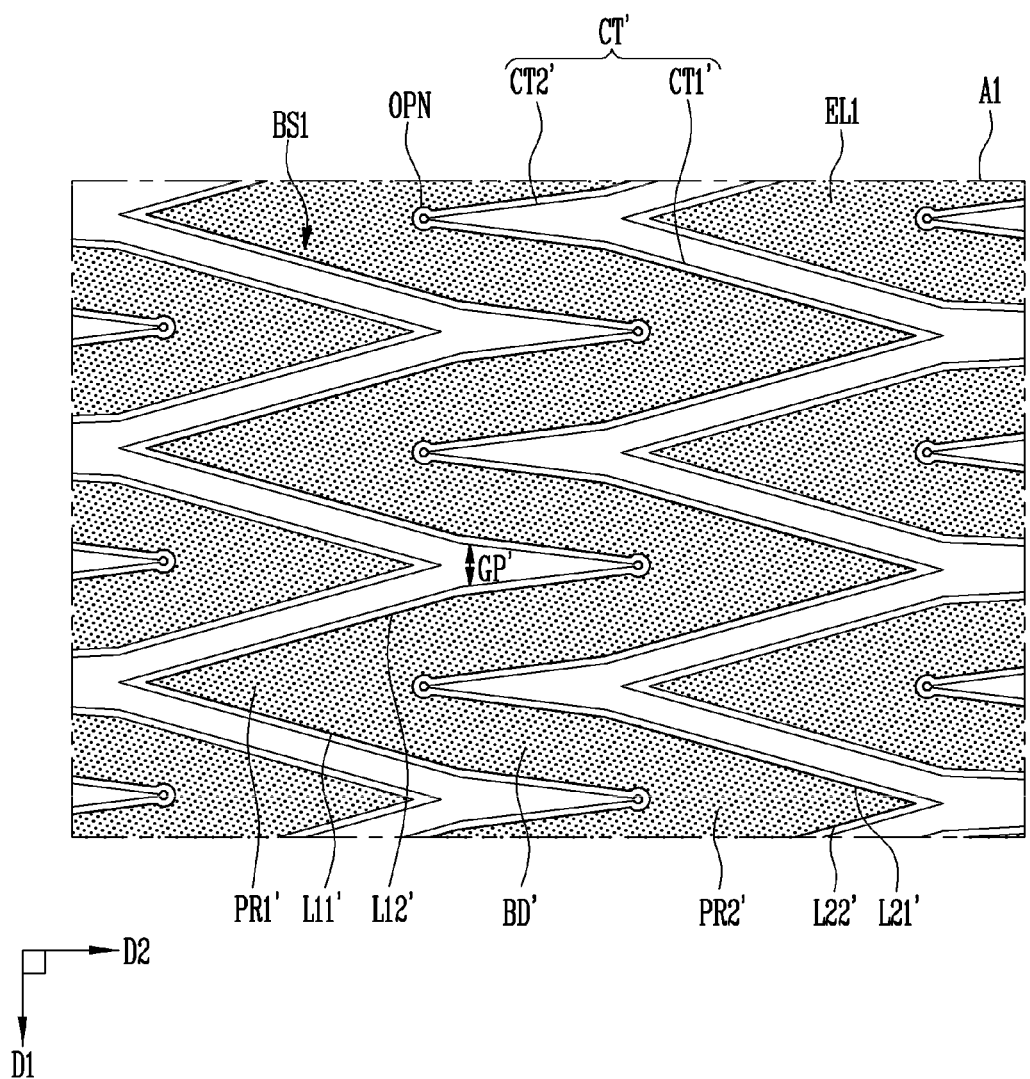
FIG. 11B is a plane view illustrating first electrodes extending in a certain direction.

The shape of the first electrodes may be changed in various types. FIG. 11A is a plane view illustrating first electrodes in an area A1 of FIG. 1 according to another embodiment of the present disclosure. FIG. 11B is a plane view illustrating first electrodes extending in a certain direction.

Referring to FIG. 11A, when viewed from the plane, the first electrodes EL1 may extend in the first direction D1, and the edge may be provided in the zigzag shape. When the direction in which the first electrodes EL1 are extended is a length direction, and the direction crossing the length direction is the width direction, the first electrodes EL1 may have the body BD' extending in the first direction D1 and the plurality of protrusions protruded from the body BD' to the width direction. The length direction may be in parallel to the first direction D1, and the width direction may be in parallel to the second direction D2.

The protrusions may have first protrusions PR1' protruded from one side to the width direction of the body BD' and second protrusions PR2' protruded from the first protrusions PR1' and the other side.

Each of the first protrusions PR1' may have a first side L11' extending to be inclined against the width direction from the body BD' to the width direction and a second side L12' extending to be inclined against the width direction from the end portion of the first side L11' and connected to the body BD'. Each of the second protrusions PR2' may have a third side L21' extending to be inclined against the width direction from the body BD' to the width direction and a fourth side L22' extending to be inclined against the width direction from the end portion of the third side L21' and connected to the body BD'.

In the first protrusions PR1', the first sides L11' and the second sides L12' may be alternately arranged on one side of the body BD' in the first direction D1. In the second protrusions PR2', the third sides L21' and the fourth sides L22' may be alternately arranged on the other side of the body BD' in the first direction D1. According to an embodiment, the inclining angle between the first sides L11' and the third sides L21' and the width direction may be the same as each other, and the inclining angle between the second sides L12' and the fourth sides L22' and the width direction may be the same as each other. Accordingly, the first sides L11' and the third sides L21' are parallel, and the second sides L12' and the fourth sides L22' are parallel. According to an embodiment, when the inclining angle between the first sides L11' or third sides L21' and the second direction D2 is θ, the angle between the second sides L12' or fourth sides L22' and the second direction D2 is −θ.

According to an embodiment, the first electrodes EL1 may have cutting patterns in which the first side L11' and the second side L12' adjacent to each other when viewed from the plane extend from the point meeting the body BD' to the inside of the body, or the third side L21' and the fourth side L22' adjacent to each other when viewed from the plane extend from the point meeting the body BD' to the inside of the body BD'. The cutting patterns may include the cutting pattern extending from one side of the body to the other side and the cutting pattern extending from the other side of the body BD' to one side. The cutting patterns may include the cutting pattern extending from one side of the body BD' to the other side, and the cutting pattern extending from the other side of the body BD' to one side may be alternately arranged in the first direction D1.

The first substrate BS1 may have the cutting portion CT' corresponding to the distance between the first electrodes EL1 adjacent to each other and the cutting patterns. According to an embodiment, an opening pattern of a circle or a polygonal shape may be provided in the end portion of the cutting patterns extending to the inside of the body BD'.

When viewed from the plane, the cutting portion CT' may have a first cutting portion CT1' formed along the edge in the zigzag shape between the first electrodes EL1 adjacent to each other. In other words, when viewed from the plane, the cutting portion CT1' may be provided between the first sides L11' and the second sides L12'.

When viewed from the plane, the cutting portion CT1' further includes a second cutting portion CT2' corresponding to the cutting patterns. The second cutting portion CT2' may be formed to correspond to the part extending from the point at which the first side L11' and the second side L12' adjacent to each other meet the body BD' to the inside of the body BD' or the part extending from the point the third side L21' and the fourth side L22' adjacent to each other meet the body BD' to the inside of the body BD'. The second cutting portion CT2' may be parallel to the width direction, which is the second direction D2.

According to an embodiment, the opening OPN in the circle or polygonal shape in the end portion of the second cutting portion CT2' extends to the inside of the body BD'. The opening OPN may disperse tension received by the end portion of the cutting portion CT to the surroundings.

FIG. 11B is a plane view illustrating the extended first electrodes EL1 and the first substrate BS1 when the tension is applied to both sides in which the first electrodes EL1 are parallel to the first direction D1.

Referring to FIG. 11B, the display apparatus including the structure described above may be changed in the shape in which the cutting patterns and the cutting portion CT' are open when the tension is applied from both sides of the first direction D1. More particularly, the first cutting portion CT1' and the second cutting portion CT2' may be open to the direction in which the tension is applied, such that a gap GP' is formed, and disperse the stress applied to the first electrodes EL1. The cutting portion CT1' corresponding to the sides L11' and the second sides L12' may be arranged to the direction inclined against the first direction D1, such that the gap GP' may be formed in the first cutting portion CT1' corresponding to the first sides L11' and the second sides L12', and further disperse the stress accordingly. As a result, the damage of the first electrodes EL1 may be minimized.

According to an embodiment, when the extension is performed in the direction parallel to the second direction, the first cutting portion and the second cutting portion may be open in the direction in which the tension is applied, such that the gap may be formed, and the stress applied to the first electrodes may be dispersed. As a result, the damage of the first electrodes may be blocked.

The display apparatus according to the embodiment, when the display apparatus is changed into the various shapes, such as by folding, bending, and rolling, for multiple times, defects (for example, separated or cracked first electrodes) may be minimized or blocked since extension rate of the sensing part arranged in the outmost display apparatus is reduced. Further, when the center of the curvature is arranged on the rear surface of the display apparatus, the sensing part may be arranged in the inner-most portion and receive the great pressure. However, the defects, for example, separated or cracked first electrodes, may be minimized or blocked due to the structure strong enough withstand high pressure like the various embodiments described above. As a result, reliability of the display apparatus according to the embodiments may be improved.

Figure 12:
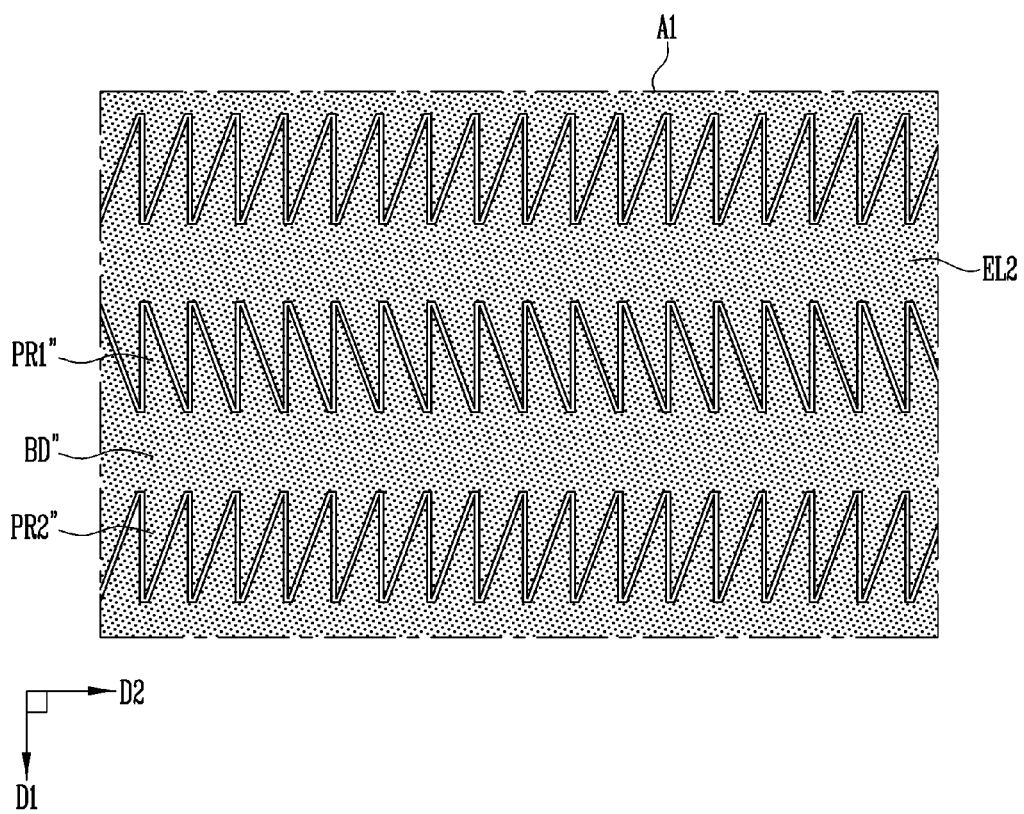
FIG. 12 is a plane view illustrating second electrodes according to an embodiment of the present disclosure.

FIG. 12 is a plane view illustrating second electrodes according to an embodiment of the present disclosure.

Referring to FIG. 12, the second electrode EL2 may have the edge of the zigzag shape when viewed from the plane. In other words, the second electrodes EL2 may have the body BD" extending in the second direction D2, and the plurality of protrusions protruded from both sides of the body BD". The protrusions may have first protrusions PR1" protruded from one side of the body BD" and second protrusions PR2" protruded from the other side.

According to an embodiment, the extension of the body BD" is not the second direction D2, but it is not limited thereto. The extension direction of the body BD" may be changed along a stress direction applied to the display apparatus DP. For example, when the folding line FL according to an embodiment of the present disclosure is parallel to the first direction, the length direction in which the second electrodes EL2 extend may be the first direction D1.

When the second electrodes EL2 are bending, folding, or rolling, the tension or stress relatively smaller than those of the first electrodes of the embodiment may be applied to the second electrodes EL2. Accordingly, freedom of the shapes of the second electrode EL2 may be relatively high, and the shape of the second electrodes EL2 may be formed differently from the descriptions above.

A display device employed in an embodiment of the present disclosure is described in the following.

Figure 13:
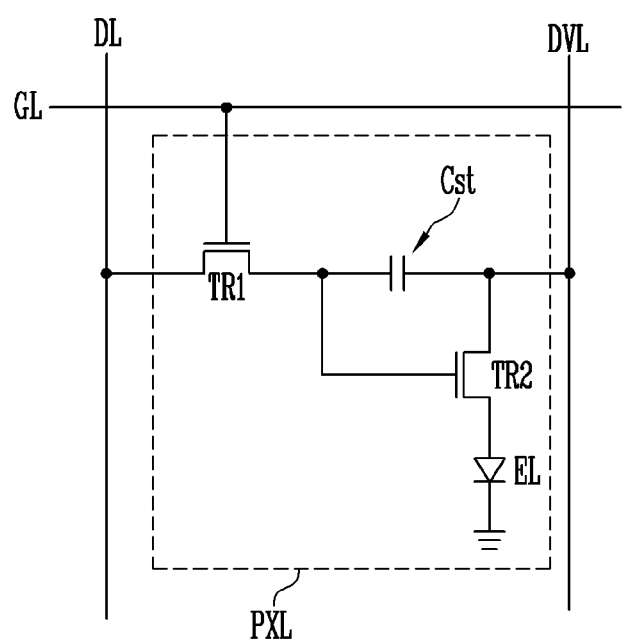
FIG. 13 is a circuit view illustrating one pixel when an organic light emitting device according to an embodiment of the present disclosure is employed to a display apparatus.

FIG. 13 is a circuit view illustrating a pixel when the organic light emitting device according to an embodiment of the present disclosure is employed to the display apparatus.

Figure 14:
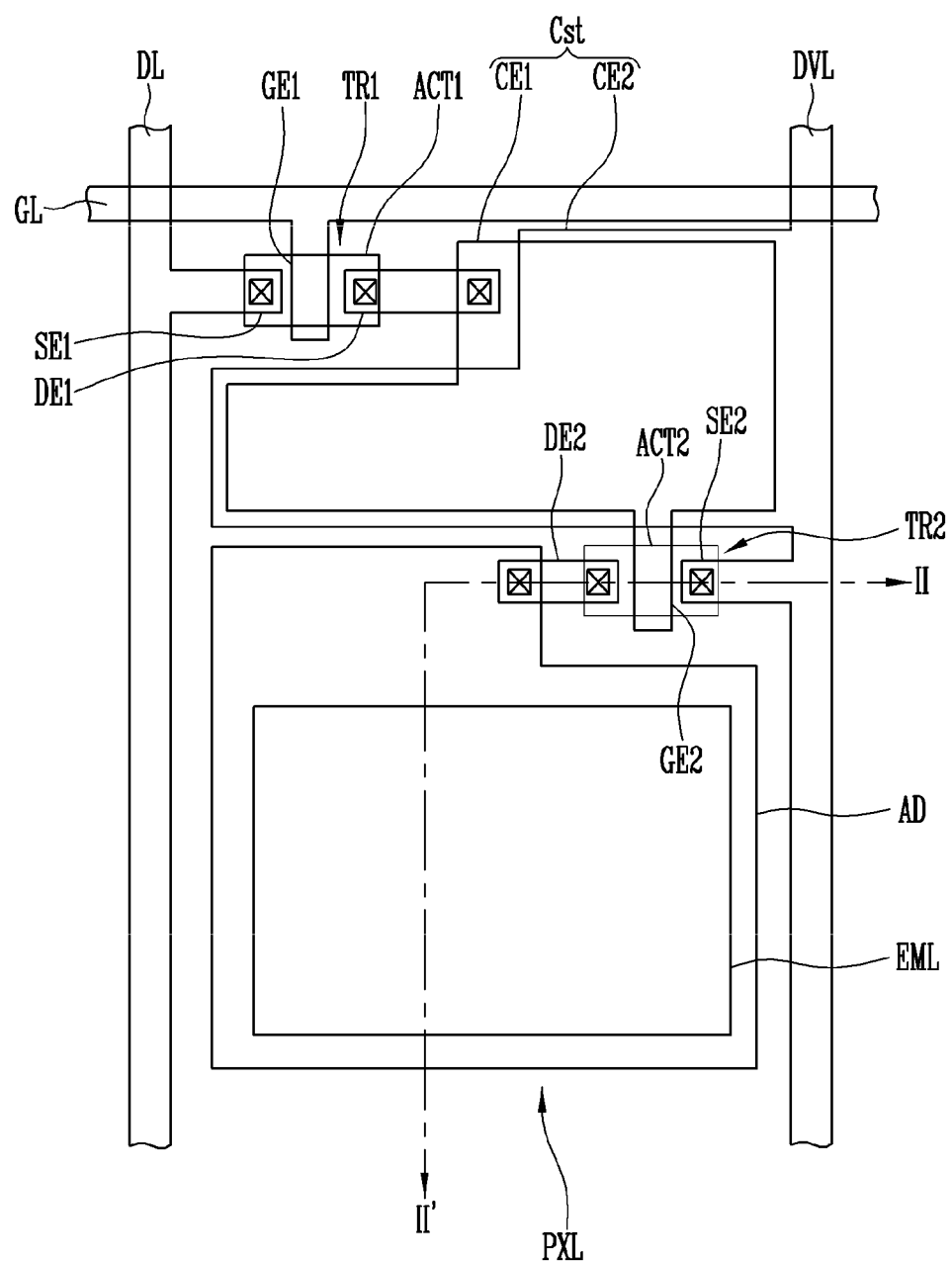
FIG. 14 is a plane view illustrating a pixel shown in FIG. 13.
Figure 15:
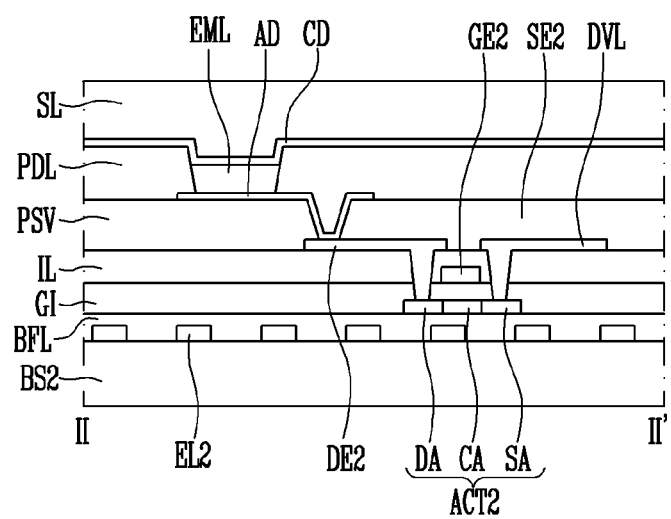
FIG. 15 is a cross-sectional view taken along line II-II' in FIG. 14.

FIG. 14 is a plane view illustrating the pixel illustrated in FIG. 13, and FIG. 15 is a cross-sectional view taken along line II-IP of FIG. 14.

Hereafter, referring to FIGS. 13 to 15, the display apparatus, which employs the organic light emitting device according to an embodiment, is described.

The display apparatus DP according to an embodiment of the present disclosure may include at least one pixel PXL. A plurality of pixels PXL may be provided in a matrix form, and the pixel PXL may emit light of a specific color, for example, a red light, a green light, and a blue light. The type of the color light is not limited thereto; for example, cyan light, magenta light, yellow light may be added.

Referring to FIGS. 13 to 15, the display part may include the second substrate BS2, a wire part, and the pixels PXL.

The pixels PXL may be provided on the second substrate BS2.

The wire part may provide a signal to the pixel PXL and include a gate line GL, a data line DL, and a driving voltage line DVL.

The gate line GL may extend to one side. The data line DL may extend to the other side that crosses the gate line GL. The driving voltage line DVL may extend in the same direction as one of the gate line GL and the data line DL, for example, substantially the same direction as the data line DL. The gate line GL may transfer a scan signal to a thin film transistor, and the data line DL may transfer a data signal to the thin film transistor, and the driving voltage line DVL may provide a driving voltage to the thin film transistor.

The plurality of gate line GL, data line DL, and driving voltage line DVL may be provided.

As described above, the pixel PXL may display the image, and the plurality of pixels PXL may be arranged in the matrix configuration, but in FIGS. 13 and 15, one pixel PXL is illustrated for the convenience. Each of the pixels PXL is illustrated to have a rectangular shape, but it is not limited thereto. In addition, the pixels PXL may be provided to have areas different from each other. For example, the pixel PXL may be provided in a different area or shape for each color.

The pixel PXL may include the thin film transistor connected to the wire part, a light emitting device EL connected to the thin film transistor, and a capacitor Cst.

The thin film transistor may have a driving thin film transistor TR2 to control the light emitting device EL and a switching thin film transistor TR1 to switch the driving thin film transistor TR2. In an embodiment of the present disclosure, one pixel PXL may have two thin film transistors TR1 and TR2 and one capacitor Cst, but the present disclosure is not limited thereto. According to an embodiment, one thin film transistor in one pixel PXL, or three or more thin film transistors in one pixel PXL, for example, six thin film transistors may be included, and the number of the capacitors may be changed.

The switching thin film transistor TR1 may include a first gate electrode GE1 and a first source electrode SE1, and a first drain electrode DE1. The first gate electrode GE1 may be connected to the gate line GL, and the first source electrode SE1 may be connected to the data line DL. The first drain electrode DE1 may be connected to the gate electrode (that is, the second gate electrode GE2) of the driving thin film transistor TR2. The switching thin film transistor TR1 may transfer the data signal applied to the data line DL to the driving thin film transistor TR2 according to the scan signal applied to the gate line GL.

The driving thin film transistor TR2 may include the second gate electrode GE2, the second source electrode SE2 and the second drain electrode DE2. The second gate electrode GE2 may be connected to the switching thin film transistor TR1, and the second source electrode SE2 may be connected to the driving voltage line DVL, and the second drain electrode DE2 may be connected to the light emitting device EL.

The light emitting device EL may include a light emitting layer EML, and an anode AD and a cathode CD oppositely facing each other with the the light emitting layer EML disposed in between. The anode AD may be connected to the second drain electrode DE2 of the driving thin film transistor TR2. A common voltage may be applied to the cathode CD, and the light emitting layer EML may emit light according to an output signal of the driving thin film transistor TR2 and display the image by emitting or transmitting the light. The light emitted from the light emitting layer EML may vary in color depending on the materials of the light emitting layer EML (e.g., color light or a white color).

The capacitor Cst may be connected between the second gate electrode GE2 of the driving thin film transistor TR2 and the second source electrode SE2, and charge and maintain the data signal input to the second gate electrode GE2 of the driving thin film transistor TR2.

Hereafter, a display part is described in stacking order according to an embodiment of the present disclosure.

The display part according to an embodiment of the present disclosure may include the second substrate BS2 in which the thin film transistor and the light emitting device EL are stacked.

A buffer layer BFL may be formed on the second substrate BS2. The buffer layer BFL may be provided on the second substrate BS2 in which the second electrodes EL2 are formed, and cover the second electrodes EL2. The buffer layer BFL may block impurities from dispersing to the switching and the driving thin film transistors TR1 and TR2. The buffer layer BFL may be formed of Silicon Nitride (SiNx), Silicon Oxide (SiOx), and Silicon Nitrification (SiOxNy), and may be omitted according to the material and procedure condition of the second substrate BS2.

A first active pattern ACT1 and a second active pattern ACT2 may be formed on the butter layer BFL. The first active pattern ACT1 and the second active pattern ACT2 may be formed of semiconductor material. Each of the first active pattern ACT1 and the second active pattern ACT2 may be provided in a source area SA, a drain area DA, and a channel area CA between the source area SA and the drain area DA. The first active pattern ACT1 and the second active pattern ACT2 may be silicon that is doped or not, for example, poly silicon or amorphous silicon, or semiconductor pattern formed of oxide semiconductor. According to an embodiment, the channel area CA may be the semiconductor pattern that is not doped with the impurities, which is an intrinsic semiconductor. The source area SA and the drain area DA may be the semiconductor pattern that is doped with the impurities. The doped impurities may be n-type impurities, p-type impurities, metals, etc.

A gate insulating layer GI may be provided on the first active pattern ACT1 and the second active pattern ACT2.

The first gate electrode GE1 and the second gate electrode GE2 connected to the gate line GL may be provided on the gate insulating layer GI. Each of the first gate electrode GE1 and the second gate electrode GE2 may be formed to cover the channel areas CA of the first active pattern ACT1 and the second active pattern ACT2.

An interlayer insulating layer IL may be provided on the first and second gate electrodes GE1 and GE2 to cover the first and second gate electrodes GE1 and GE2.

The first source electrode SE1, the first drain electrode DE1, the second source electrode SE2, and the second drain electrode DE2 may be provided on the interlayer insulating layer IL. The first source electrode SE1 and the first drain electrode DE1 may contact the source area SA and the drain area DA of the first active pattern ACT1 via contact holes formed in the gate insulating layer GI and the interlayer insulating layer IL. The second source electrode SE2 and the second drain electrode DE2 may be contacted to the source area SA and the drain area DA of the second active pattern ACT2 via contact holes formed in the gate insulating layer GI and the interlayer insulating layer IL.

Each of a part of the second gate electrode GE2 and a part of the driving voltage line DVL may be a first capacitor electrode CE1 and a second capacitor electrode CE2, and comprise the capacitor Cst between the interlayer insulating layers IL.

A protecting layer PSV may be provided on the first electrode source SE1, the first drain electrode DE1, the second source electrode SE2, and the second drain electrode DE2. The protecting layer PSV may protect the switching and the driving thin film transistors TR1 and TR2 and planarize the front surface.

The anode of the light emitting EL may be provided on the protecting layer PSV. The anode may be connected to the second drain electrode DE2 of the driving thin film transistor TR2 through a contact hole formed in the protecting layer PSV.

A pixel definition layer that divides the pixel area PA may be provided corresponding to the pixel PXL on the second substrate BS2 in which the anode AD is formed. The pixel definition layer PDL may expose the front surface of the anode AD and be protruded from the second substrate BS2 according to a perimeter of the pixel PXL.

The light emitting layer EML may be provide in the pixel area PA surrounded by the pixel definition layer PDL, and the cathode CD may be provided on the light emitting layer EML.

An encapsulation layer SL may be provided on the cathode CD to cover the cathode CD.

The display apparatus having the structure described above and the embodiments are used in various types of products, for example, a mobile device, a smartphone electronic book, a laptop computer, a notebook computer, a tablet computer, a personal computer or a signboard, but it is not limited thereto.

According to embodiments, a slim display apparatus thinner than the conventional display apparatus is provided.

According to embodiments, a display apparatus having minimized peripheral area is provided, and a display apparatus having a narrow bezel is embodied accordingly.

According to embodiments, an efficient method of manufacturing a display apparatus is provided.

Embodiments are provided to help convey the spirit of the invention to those skilled in the art to which the invention pertains. The scope of the invention should be understood by the claims presented herein. Accordingly, those of skill in the art that various would recognize that changes in form and details may be made without departing from the spirit and scope of the invention as set forth in the following claims. Therefore, the technical range of the present invention is not limited to the detailed description of the specification but defined by the range of the claims.

What is claimed is:
1. A display apparatus, comprising:
a first substrate;

a spacer on the first substrate, the spacer including an elastic material;
a second substrate on the spacer;
a pixel on the second substrate, and the pixel is configured to display an image; and
a sensing part including a first electrode provided between the first substrate and the spacer and a second electrode provided between the spacer and the pixel,
wherein the pixel includes a thin film transistor which is not in direct contact with the spacer,
wherein the spacer is disposed between the first electrode and the second electrode, and
wherein an adhesive layer is disposed on the first substrate and the first electrode and configured to attach the first substrate to the spacer or disposed on the second substrate and the spacer and configured to attach the second substrate to the spacer,
wherein the first substrate includes a cutting portion provided between the first electrode and another first electrode adjacent to the first electrode, and
wherein the cutting portion includes an opening for distributing stress of the cutting portion.

2. The display apparatus of claim 1, wherein the second electrode is provided between the second substrate and the pixel.

3. The display apparatus of claim 1, wherein the second electrode is provided between the spacer and the second substrate.

4. The display apparatus of claim 1, wherein the second substrate includes a first sub-substrate and a second sub-substrate sequentially stacked, and the second electrode is provided between the first sub-substrate and the second sub-substrate.

5. The display apparatus of claim 1, wherein when viewed from a plane, the first electrode extends in a first direction, and the second electrode extends in a second direction crossing the first direction.

6. The display apparatus of claim 5, wherein the first electrode includes an edge having a zigzag pattern and a plurality of bodies extending in the first direction, a plurality of first protrusions protruding from one side of a body of the plurality of bodies, and a plurality of second protrusions protruding from another side of the body in the second direction,
each of the first protrusions includes a first side extended outwardly from the body and a second side extended from an end portion of the first side and connected to the body,
each of the second protrusions includes a third side extended outwardly from the body and a fourth side extended from an end portion of the third side and connected to the body,
a first angle between the first side and the second side is an acute angle, and
a second angle between the third side and the fourth side is an acute angle.

7. The display apparatus of claim 6, wherein
the first side and the third side are in parallel, and the second side and the fourth side are in parallel.

8. The display apparatus of claim 7, wherein the first side and the third side are parallel to the second direction.

9. The display apparatus of claim 7, wherein the first and fourth sides are inclined against the first direction.

10. The display apparatus of claim 7, wherein the first and second sides are alternately arranged on the one side of the body in the first direction, and the third and fourth sides are alternately arranged on the another side of the body in the first direction.

11. The display apparatus of claim 7, wherein when viewed from the plane, the first electrode includes the edge patterns extended from a point at which the first and second sides adjacent to each other meet the body to an inside of the body, or extended from a point at which the third and fourth sides adjacent to each other meet the body to the inside of the body.

12. The display apparatus of claim 11, wherein the edge patterns extended from the one side of the body to the another side of the body and extended from the another side of the body to the one side of the body are alternately arranged in the first direction.

13. The display apparatus of claim 5, wherein, when viewed from the plane, the second electrode includes an edge having a zigzag pattern.

14. The display apparatus of claim 13, wherein the second electrode includes a body extending in the second direction and a plurality of protrusions protruded from the body.

15. The display apparatus of claim 5, wherein the display apparatus includes a flexible area having flexibility, a first rigid area, and a second rigid area, and the first rigid area and the second rigid area are arranged opposite to each other after the display apparatus is folded along a folding line.

16. The display apparatus of claim 15, wherein the folding line is parallel to the second direction.

17. The display apparatus of claim 11, wherein when viewed from the plane, the cutting portion is provided along the first to fourth sides.

18. The display apparatus of claim 17, wherein when viewed from the plane, the cutting portion extends to the inside of the body along the edge patterns.

19. The display apparatus of claim 18, wherein the opening is provided in an end portion of the cutting portion extending to the inside of the body.

20. The display apparatus of claim 1, wherein the cutting portion is provided as a groove recessed into a surface of the first substrate.

21. The display apparatus of claim 1, wherein the cutting portion penetrates the first substrate.

22. The display apparatus of claim 1, wherein the sensing part senses at least one of a touch or a pressure from the outside.

23. The display apparatus of claim 22, wherein the sensing part senses at least one of the touch or the pressure in a direction from the first electrode to the second electrode.

24. The display apparatus of claim 22, wherein the sensing part senses at least one of the touch or the pressure in a direction from the second electrode to the first electrode.

25. The display apparatus of claim 1, further comprising an additional sensing part arranged in the pixel and sensing a touch.

26. The display apparatus of claim 1, wherein the first electrode is a driving electrode and the second electrode is a sensing electrode.

27. The display apparatus of claim 1, wherein the pixel is one of a liquid crystal device, an organic light emitting device, an electrophoretic device, and an electrowetting device.

28. A manufacturing method of a display apparatus, the manufacturing method comprising:
forming a first substrate on which a first electrode is formed;
forming a second substrate on which a second electrode is formed;

forming a pixel on one side of the second substrate; and
attaching the first substrate to an other side of the second substrate such that the first electrode and the second electrode are spaced apart from each other with a spacer interposed therebetween,
wherein the pixel includes a thin film transistor which is not in direct contact with the spacer,
wherein the spacer includes an elastic material and is disposed between the first electrode and the second electrode, and
wherein an adhesive layer is disposed on the first substrate and the first electrode and configured to attach the first substrate to the spacer or disposed on the second substrate and the spacer and configured to attach the second substrate to the spacer,
wherein the first substrate includes a cutting portion provided between the first electrode and another first electrode adjacent to the first electrode, and
wherein the cutting portion includes an opening for distributing the stress of the cutting portion.

* * * * *